(12) United States Patent
Yano

(10) Patent No.: US 7,154,303 B2
(45) Date of Patent: Dec. 26, 2006

(54) DYNAMIC CIRCUIT

(75) Inventor: Junichi Yano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/247,337

(22) Filed: Oct. 12, 2005

(65) Prior Publication Data

US 2006/0028246 A1 Feb. 9, 2006

Related U.S. Application Data

(63) Continuation of application No. 10/616,908, filed on Jul. 11, 2003, now Pat. No. 6,967,502.

(30) Foreign Application Priority Data

Jul. 11, 2002 (JP) .............................. 2002-202148

(51) Int. Cl.
*H03K 19/096* (2006.01)
(52) U.S. Cl. .............................. 326/97; 326/96; 326/98
(58) Field of Classification Search ............. 326/93–98
See application file for complete search history.

(56) References Cited

U.S. PATENT DOCUMENTS

| | | | |
|---|---|---|---|
| 6,002,271 A | 12/1999 | Chu et al. | |
| 6,002,292 A | 12/1999 | Allen et al. | |
| 6,097,207 A | 8/2000 | Bernstein et al. | |
| 6,184,718 B1 * | 2/2001 | Tran et al. | 326/121 |
| 6,326,814 B1 | 12/2001 | Stasiak et al. | |
| 6,549,040 B1 * | 4/2003 | Alvandpour et al. | 326/98 |

* cited by examiner

*Primary Examiner*—Anh Q. Tran
(74) *Attorney, Agent, or Firm*—McDermott Will & Emery LLP

(57) ABSTRACT

In a dynamic circuit, when only between a precharge node and an intermediate node through a plurality of logical-operating MOS transistors is conducted, the potential of the precharge node approximately drops to High*{C1/(C1+C2)} from High, where C1 represents the capacitance of the precharge node and C2 represents the capacitance of the intermediate node. Thereafter, with the charge from a power supply, the precharge node returns to High. At this charge sharing time, the amount of charge supply from the power supply is adjusted to suppress voltage drop of the precharge node, thereby reducing noise.

12 Claims, 17 Drawing Sheets

DYNAMIC CIRCUIT

RELATED APPLICATIONS

This application is a continuation of application Ser. No. 10/616,908, filed Jul. 11, 2003 is now a U.S. Pat. No. 6,967,502, which claims priority of Japanese Patent Application No. 2002-202148, filed Jul. 11, 2002, the contents of which are hereby incorporated by reference.

BACKGROUND OF THE INVENTION

The present invention relates to a technique of reducing noise and noise-induced operational failure in a dynamic circuit that uses MOS transistors.

Recently, in the field of semiconductor integrated circuits, process has been increasingly refined, enabling various advantages, such as high-speed operation, area saving, low power consumption and the like. With refined process, as low power supply voltage is necessary, it concurrently causes problems of noise immunity of a circuit.

Conventionally, a circuit called dynamic circuit has been used as one of the circuits for high-speed operation.

FIG. 15 illustrates an example of a conventional dynamic circuit.

Referring to FIG. 15, a reference numeral 101 denotes a P-type MOS transistor. The gate terminal of the P-type MOS transistor 101 is connected to a clock input terminal 107. When a clock signal CK from the clock input terminal 107 is Low ("Low" represents a ground voltage), a precharge node 112 is charged to High ("High" represents a power supply voltage). Reference numerals 102, 103 and 104 denote N-type MOS transistors. The gate terminals of the N-type MOS transistors 102 to 104 are connected to input terminals 108 and 109 and the clock input terminal 107, respectively, and the N-type MOS transistors 102 and 103 are connected together via an intermediate node 113. An input signal A from the input terminal 108 and an input signal B from the input terminal 109 fall in the Low period of the clock signal CK, and maintain at Low or rise in the High period thereof A reference numeral 105 denotes an inverter that uses the precharge node 112 as an input, and an inversion output thereof is connected to an output terminal 111. A reference numeral 106 denotes a P-type MOS transistor that is conducted when an output signal from the output terminal 111 is at Low, that is, when the precharge node 112 is at High, and the precharge node 112 is thereby maintained at High. The drivability of the P-type type MOS transistor 106 is set lower than those of the N-type MOS transistors 102, 103 and 104. When the N-type MOS transistors 102, 103 and 104 are conducted, the precharge node 112 falls. FIG. 16 illustrates waveforms of signals of the dynamic circuit in FIG. 15.

Hereinafter, operation of the conventional dynamic circuit described above will be described.

First, the clock signal. CK falls, the P-type MOS transistor 101 is conducted, and the precharge node 112 rises. Subsequently, when the clock signal CK rises, only when the input signals A and B rise, the ground terminal is conducted from the precharge node 112, and the precharge node 112 falls. The signal of the precharge node 112 is outputted to the output terminal 111 through the inverter 105. As such, the output signal falls in the Low period of the clock signal CK, and AND operation results of the input terminals 108 and 109 are outputted in the High period of the clock signal CK.

FIG. 17 illustrates another example of a conventional dynamic circuit.

The dynamic circuit of FIG. 17 differs from the dynamic circuit of FIG. 15 in that the N-type MOS transistor 104 is not provided. However, the other parts of the two dynamic circuits are same to each other, and the operations thereof are also similar to each other.

For example, as shown in FIG. 15, in the conventional dynamic circuit, when only the input signal A rises while the input signal B maintains at Low in the High period of the clock signal CK, only between the precharge node 112 and the intermediate node 113 is conducted. As such, when no charge is accumulated in the intermediate node 113, the charge in the precharge node 112 is shared to the intermediate node 113. Concurrently, the potential of the precharge node 112 approximately drops to the level of High*{C1/(C1+C2)} from High, where C1 represents the capacitance of the precharge node 112 and C2 represents the capacitance of the intermediate node 113. Thereafter, the charge is supplied from the power supply through the P-type MOS transistor 106, returns the precharge node 112 to High. FIG. 16 shows waveforms of the operations described above.

As such, in the dynamic circuit including the intermediate node 113, noise is generated in some cases in the precharge node 112 depending on the combination of values of the input terminals. Due to the noise, it is possible that the noise immunity of the circuit is decreased or, in the worst case, the circuit can cause operational failure.

In order to solve the conventional problems, there is a method of enhancing the drivability of the P-type MOS transistor 106. In that case, the speed of turning the precharge node 112 into Low by the N-type MOS transistors 102, 103 and 104 is reduced, thereby impeding high-speed operation of the circuit.

SUMMARY OF THE INVENTION

An object of the present invention is to reduce noise due to charge sharing in a dynamic circuit.

Specifically, a dynamic circuit according to the present invention includes: a clock input terminal; a plurality of input terminals; a precharge MOS transistor connecting a source-drain path between a first potential power supply and a precharge node and connecting a gate terminal to the clock input terminal; and a plurality of logical-operating MOS transistors, wherein gate terminals of the plurality of logical-operating MOS transistors are connected to one of the plurality of input terminals, respectively, at least one intermediate node is formed to connect the source-drain paths of the plurality of logical-operating MOS transistors between the precharge node and a second potential power supply, and the precharge MOS transistor is conductive even after formation of a conductive path from the intermediate node to the precharge node.

A dynamic circuit according to the present invention includes: a first clock input terminal; a second clock input terminal; a plurality of input terminals; a precharge MOS transistor connecting a source-drain path between a first potential power supply and a precharge node and connecting a gate terminal to the first clock input terminal; a discharge MOS transistor connecting a source-drain path between a discharge node and a second potential power supply and connecting a gate terminal to the second clock input terminal; and a plurality of logical-operating MOS transistors, wherein gate terminals of the plurality of logical-operating MOS transistors are connected to one of the plurality of input terminals, respectively, at least one intermediate node is formed to connect the source-drain paths of the plurality of logical-operating MOS transistors between the precharge node and the discharge node, and the precharge MOS transistor is conductive even after formation of a conductive path from the intermediate node to the precharge node.

In the dynamic circuit according to the present invention, a clock signal applied to the clock input terminal connected to the gate terminal of the precharge MOS transistor is delayed so that the precharge MOS transistor is conducted even after the formation of the conductive path from the intermediate node to the precharge node.

In the dynamic circuit according to the present invention, a clock signal applied to the clock input terminal connected to the gate terminal of the precharge MOS transistor is produced by performing a logical operation with signals applied to the input terminals so that the precharge MOS transistor is conducted even after the formation of the conductive path from the intermediate node to the precharge node.

According to the present invention described above, when the charge is shared from the precharge node to the intermediate node, the precharge MOS transistor supplies the charge to the precharge node, so that noise due to charge sharing can be reduced. Further, according to the present invention, when the charge is shared from the precharge node to the intermediate node, the precharge MOS transistor supplies the charge to the precharge node, so that noise due to charge sharing can be reduced. In addition, when the charge need not be supplied to the precharge node, the charge is not supplied thereto, thereby preventing the circuit operation speed from being reduced.

A dynamic circuit according to the present invention includes: a first clock input terminal; a plurality of input terminals; a precharge MOS transistor connecting a source-drain path between a first potential power supply and a precharge node and connecting a gate terminal to the first clock input terminal; and a plurality of logical-operating MOS transistors, wherein gate terminals of the plurality of logical-operating MOS transistors are connected to the plurality of input terminals, respectively, and at least one intermediate node is formed to connect the source-drain paths of the plurality of logical-operating MOS transistors between the precharge node and a second potential power supply. The dynamic circuit further includes: a second clock input terminal; and a precharge MOS transistor, different from the precharge MOS transistor, connecting the source-drain path between the first potential power supply and the precharge node and connecting the gate terminal to the second clock input terminal, wherein the different precharge MOS transistor is conductive from the time of formation of a conductive path from the intermediate node to the precharge node.

A dynamic circuit according to the present invention includes: a first clock input terminal; a second clock input terminal; a plurality of input terminals; a precharge MOS transistor connecting a source-drain path between a first potential power supply and a precharge node and connecting a gate terminal to the first clock input terminal; a discharge MOS transistor connecting a source-drain path between a discharge node and a second potential power supply and connecting a gate terminal to the second clock input terminal;

and a plurality of logical-operating MOS transistors, wherein gate terminals of the plurality of logical-operating MOS transistors are connected to one of the plurality of input terminals, respectively, and at least one intermediate node is formed to connect the source-drain paths of the plurality of logical-operating MOS transistors between the precharge node and the discharge node. The dynamic circuit further includes: a third clock input terminal; and a precharge MOS transistor, different from the precharge MOS transistor, connecting a source-drain path between the first potential power supply and the precharge node and connecting a gate terminal to the third clock input terminal, wherein the different precharge MOS transistor is conductive from the time of formation of a conductive path from the intermediate node to the precharge node.

In the dynamic circuit according to the present invention, a clock signal applied to the clock input terminal connected to the gate terminal of the different precharge MOS transistor is delayed so that the different precharge MOS transistor is conducted from the time of the formation of the conductive path from the intermediate node to the precharge node.

In the dynamic circuit according to the present invention, a clock signal applied to the clock input terminal connected to the gate terminal of the different precharge MOS transistor is produced by performing a logical operation with signals applied to the input terminals so that the different precharge MOS transistor is conducted from the time of the formation of the conductive path from the intermediate node to the precharge node.

According to the present invention described above, when the charge is shared from the precharge node to the intermediate node, the different precharge MOS transistor supplies the charge to the precharge node, so that noise due to charge sharing can be reduced. In addition, by independently providing the two precharge MOS transistors, optimal charge effective for reducing noise due to the charge sharing can be supplied. Further, when the charge is shared from the precharge node to the intermediate node, the precharge MOS transistor supplies the charge to the precharge node, so that noise due to charge sharing can be reduced. In addition, when the charge need not be supplied to the precharge node, the charge is not supplied thereto, thereby preventing the circuit operation speed from being reduced.

A dynamic circuit according to the present invention includes: a first clock input terminal; a plurality of input terminals; a precharge MOS transistor connecting a source-drain path between a first potential power supply and a precharge node and connecting a gate terminal to the first clock input terminal; and a plurality of logical-operating MOS transistors, wherein gate terminals of the plurality of logical-operating MOS transistors are connected to one of the plurality of input terminals, respectively, and at least one intermediate node is formed to connect the source-drain paths of the plurality of logical-operating MOS transistors between the precharge node and a second potential power supply. The dynamic circuit further includes: a second clock input terminal; and a precharge MOS transistor, different from the precharge MOS transistor, connecting a source-drain path between the first potential power supply and the precharge node and connecting a gate terminal to the second clock input terminal, wherein the different precharge MOS transistor is conductive even after formation of a conductive path from the intermediate node to the precharge node.

A dynamic circuit according to the present invention includes: a first clock input terminal; a second clock input terminal; a plurality of input terminals; a precharge MOS transistor connecting a source-drain path between a first potential power supply and a precharge node and connecting a gate terminal to the first clock input terminal; a discharge MOS transistor connecting a source-drain path between a discharge node and a second potential power supply and connecting a gate terminal to the second clock input terminal; and a plurality of logical-operating MOS transistors, wherein gate terminals of the plurality of logical-operating MOS transistors are connected to one of the plurality of input terminals, respectively, and at least one intermediate node is formed to connect the source-drain paths of the plurality of logical-operating MOS transistors between the precharge node and the discharge node. The dynamic circuit further includes: a third clock input terminal; and a precharge MOS transistor, different from the precharge MOS transistor, connecting a source-drain path between the first potential power supply and the precharge node and connecting a gate terminal to the third clock input terminal, wherein the different precharge MOS transistor is conductive even after formation of a conductive path from the intermediate node to the precharge node.

In the dynamic circuit according to the present invention, a clock signal applied to the clock input terminal connected to the gate terminal of the different precharge MOS transistor is delayed so that the different precharge MOS transistor is conducted even after the formation of the conductive path from the intermediate node to the precharge node.

In the dynamic circuit according to the present invention, a clock signal applied to the clock input terminal connected to the gate terminal of the different precharge MOS transistor is produced by performing a logical operation with signals applied to the input terminals so that the different precharge MOS transistor is conducted even after the formation of the conductive path from the intermediate node to the precharge node.

According to the present invention described above, when the charge is shared from the precharge node to the intermediate node, the different precharge MOS transistor supplies the charge to the precharge node, so that noise due to charge sharing can be reduced. In addition, when the precharge MOS transistor is conducted, the different precharge MOS transistor also can be conductive and the charge supply to the precharge node can be concurrently used for the different precharge MOS transistor. Hence, the size of the precharge MOS transistor can be reduced. Further, when the charge is shared from the precharge node to the intermediate node, the precharge MOS transistor supplies the charge to the precharge node, so that noise due to charge sharing can be reduced. In addition, when the charge need not be supplied to the precharge node, the charge is not supplied thereto, thereby preventing the circuit operation speed from being reduced.

A dynamic circuit according to the present invention includes: a clock input terminal; a plurality of input terminals; a precharge MOS transistor connecting a source-drain path between a first potential power supply and a precharge node and connecting a gate terminal to the clock input terminal; and a plurality of logical-operating MOS transistors, wherein gate terminals of the plurality of logical-operating MOS transistors are connected to one of the plurality of input terminals, respectively, and at least one intermediate node is formed to connect the source-drain paths of the plurality of logical-operating MOS transistors between the precharge node and a second potential power supply. The dynamic circuit further includes: precharge MOS transistors, different from the precharge MOS transistor, smaller than the logical-operating MOS transistors in number, wherein gate terminals of the different precharge MOS transistors are connected to some of the plurality of input terminals, source-drain paths of the different precharge MOS transistors are connected between the first potential power supply and the precharge node, and the first potential power supply and the precharge node is conductive by the different precharge MOS transistors in all cases where the precharge node and the second potential power supply is not conducted and the precharge node and the intermediate node is conducted by the logical-operating MOS transistors.

A dynamic circuit according to the present invention includes: a first clock input terminal; a second clock input terminal; a plurality of input terminals; a precharge MOS transistor connecting a source-drain path between a first potential power supply and a precharge node and connecting a gate terminal to the first clock input terminal; a discharge MOS transistor connecting a source-drain path between a discharge node and a second potential power supply and connecting a gate terminal to the second clock input terminal; and a plurality of logical-operating MOS transistors, wherein gate terminals of the plurality of logical-operating MOS transistors are connected to one of the plurality of input terminals, respectively, and at least one intermediate node is formed to connect the source-drain paths of the plurality of logical-operating MOS transistors between the precharge node and the discharge node. The dynamic circuit further includes: precharge MOS transistors, different from the precharge MOS transistor, smaller than the logical-operating MOS transistors in number, wherein gate terminals of the different precharge MOS transistors are connected to some of the plurality of input terminals, source-drain paths of the different precharge MOS transistors are connected between the first potential power supply and the precharge node, and the first potential power supply and the precharge node is conductive by the different precharge MOS transistors in all cases where the precharge node and the second potential power supply is not conducted and the precharge node and the intermediate node is conducted by the logical-operating MOS transistors.

According to the present invention described above, when the charge is shared from the precharge node to the intermediate node, the different precharge MOS transistor supplies the charge to the precharge node, so that noise due to charge sharing can be reduced. In addition, the noise reduction can be realized without an additional circuit for the clock signal.

A dynamic circuit according to the present invention includes: a first clock input terminal; a plurality of input terminals; a precharge MOS transistor connecting a source-drain path between a first potential power supply and a precharge node and connecting a gate terminal to the first clock input terminal; and a plurality of logical-operating MOS transistors, wherein gate terminals of the plurality of logical-operating MOS transistors are connected to one of the plurality of input terminals, respectively, and at least one intermediate node is formed to connect the source-drain paths of the plurality of logical-operating MOS transistors between the precharge node and a second potential power supply. The dynamic circuit further includes: a second clock input terminal; and at least one precharge MOS transistor, different from the precharge MOS transistor, connecting a source-drain path between the first potential power supply and the intermediate node and connecting a gate terminal to the second clock input terminal, wherein the different precharge MOS transistor is made conductive from the time of formation of a conductive path from the intermediate node to the precharge node.

A dynamic circuit according to the present invention includes: a first clock input terminal; a second clock input terminal; a plurality of input terminals; a precharge MOS transistor connecting a source-drain path between a first potential power supply and a precharge node and connecting a gate terminal to the first clock input terminal; a discharge MOS transistor connecting a source-drain path between a discharge node and a second potential power supply and connecting a gate terminal to the second clock input terminal; and a plurality of logical-operating MOS transistors, wherein gate terminals of the plurality of logical-operating MOS transistors are connected to one of the plurality of input terminals, respectively, and at least one intermediate node is formed to connect the source-drain paths of the plurality of logical-operating MOS transistors between the precharge node and the discharge node. The dynamic circuit further includes: a third clock input terminal; and a precharge MOS transistor, different from the precharge MOS transistor, connecting a source-drain path between the first potential power supply and the intermediate node and connecting a gate terminal to the third clock input terminal, wherein the different precharge MOS transistor is conductive from the time of formation of a conductive path from the intermediate node to the precharge node.

In the dynamic circuit according to the present invention, a clock signal applied to the second clock input terminal is delayed so that the different precharge MOS transistor is conducted from the time of the formation of the conductive path from the intermediate node to the precharge node.

In the dynamic circuit according to the present invention, a clock signal applied to the second clock input terminal is produced by performing a logical operation with signals applied to the input terminals so that the different precharge MOS transistor is conducted from the time of the formation of the conductive path from the intermediate node to the precharge node.

According to the present invention described above, when the charge is shared from the precharge node to the intermediate node, the different precharge MOS transistor supplies the charge to the intermediate node, so that noise due to charge sharing can be reduced. In addition, in a dynamic circuit including a plurality of intermediate nodes, by providing the different precharge MOS transistor in each intermediate node, optimal charge effective for reducing noise due to the charge sharing can be supplied. Further, when the charge is shared from the precharge node to the intermediate node, the precharge MOS transistor supplies the charge to the precharge node, so that noise due to charge sharing can be reduced. In addition, when the charge need not be supplied to the precharge node, the charge is not supplied thereto, thereby preventing the circuit operation speed from being reduced.

DETAILED DESCRIPTION OF THE INVENTION

Hereinafter, dynamic circuits according to embodiments of the present invention will be described with reference to the drawings.

Embodiment 1

Figure 1:
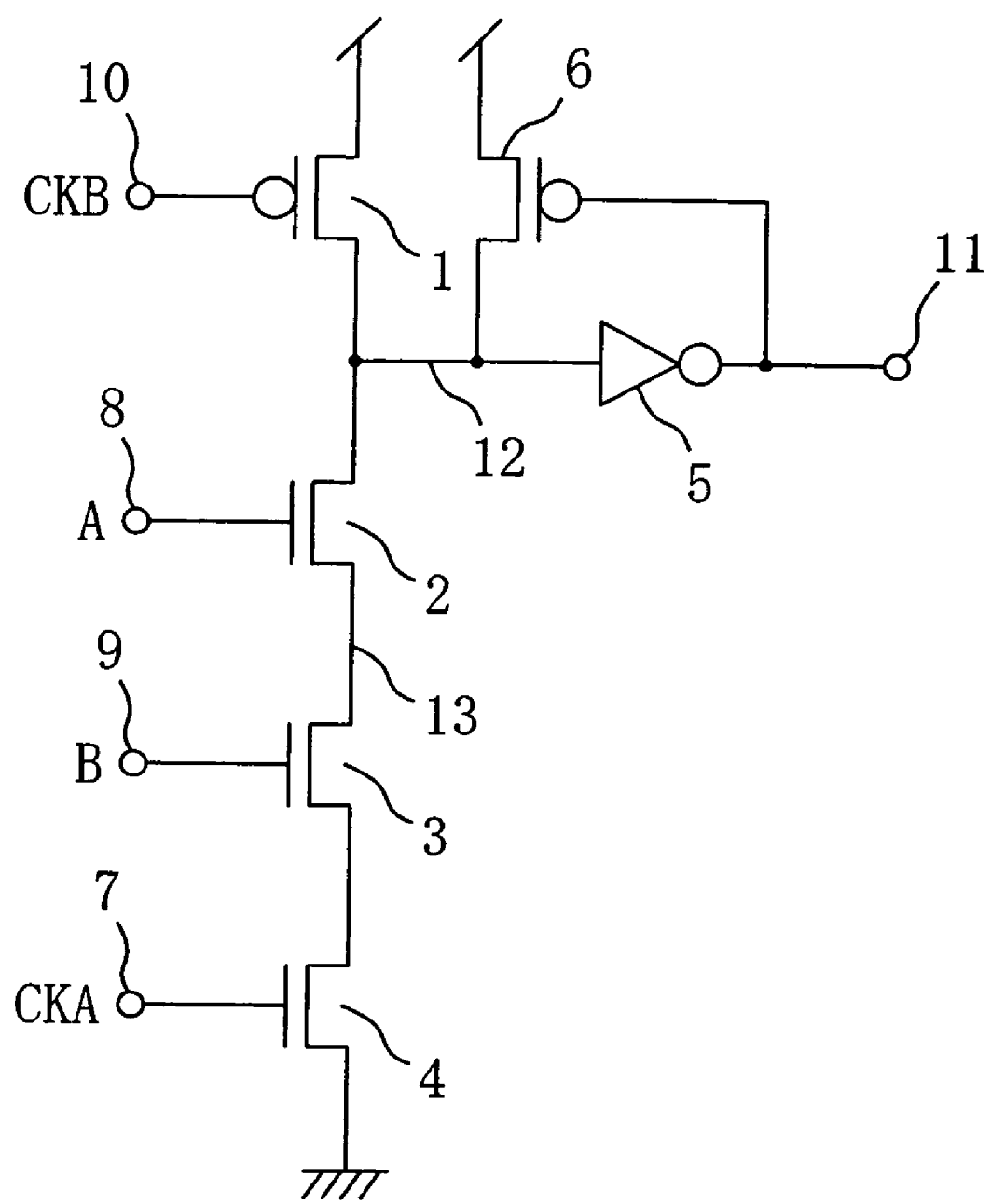
FIG. 1 is a circuit diagram of dynamic circuits according to first and fourth embodiments of the present invention.

FIG. 1 is a circuit diagram of a dynamic circuit according to a first embodiment of the present invention. Referring to FIG. 1, a reference numeral 1 denotes a P-type MOS transistor. The gate terminal of the P-type MOS transistor 1 is connected to a second clock input terminal 10. A precharge node 12 is charged to High in the Low period of a second clock signal CKB from the second clock input terminal 10. Reference numerals 2 to 4 denote N-type MOS transistors. The gate terminals of the N-type MOS transistors 2 to 4 are connected to input terminals 8 and 9 and a first clock input terminal 7, respectively. The N-type MOS transistor 2 is connected to the N-type MOS transistor 3 via an intermediate node 13. An input signal A from the input terminal 8 and an input signal B from the input terminal 9 fall in the Low period of the first clock signal CKA from the first clock input terminal 7. The input signals A and B maintain at Low or rise in the High period of the first clock signal CKA. Symbol "T1" represents an interval between when the first clock signal CKA rises and when the input signal A rises. A reference numeral 5 denotes an inverter that uses a precharge node 12 as an input, and an inversion output thereof is connected to an output terminal 11. A reference numeral 6 denotes a P-type MOS transistor. When an output signal from the output terminal 11 is Low, that is, when the precharge node 12 is High, the P-type MOS transistor 6 is conducted and the precharge node 12 is thereby maintained at High. The drivability of the P-type MOS transistor 6 is set lower than that of each of the N-type MOS transistors 2 to 4. When the N-type MOS transistors 2 and 4 are conducted, the precharge node 12 falls.

Figure 2:
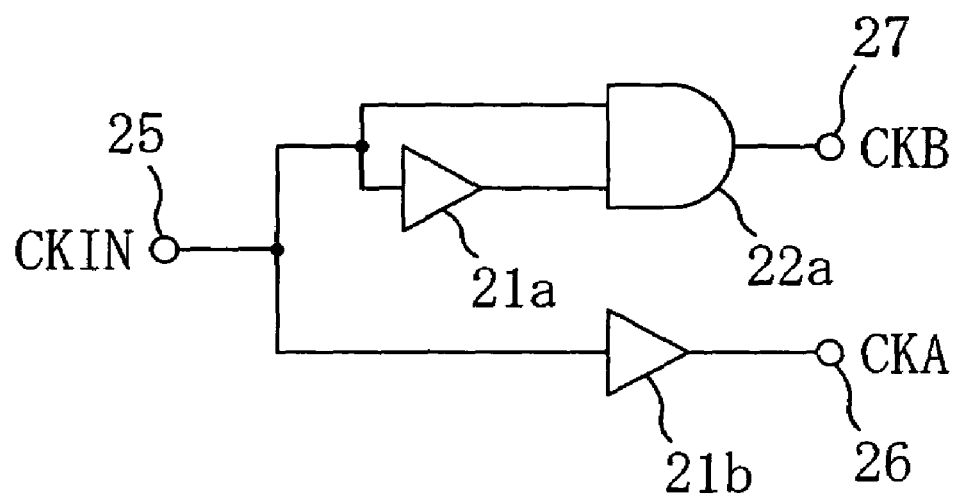
FIG. 2 is a circuit diagram of a clock-signal generation circuit of the dynamic circuit according to the first embodiment and a dynamic circuit according to the second embodiment of the present invention.
Figure 3:
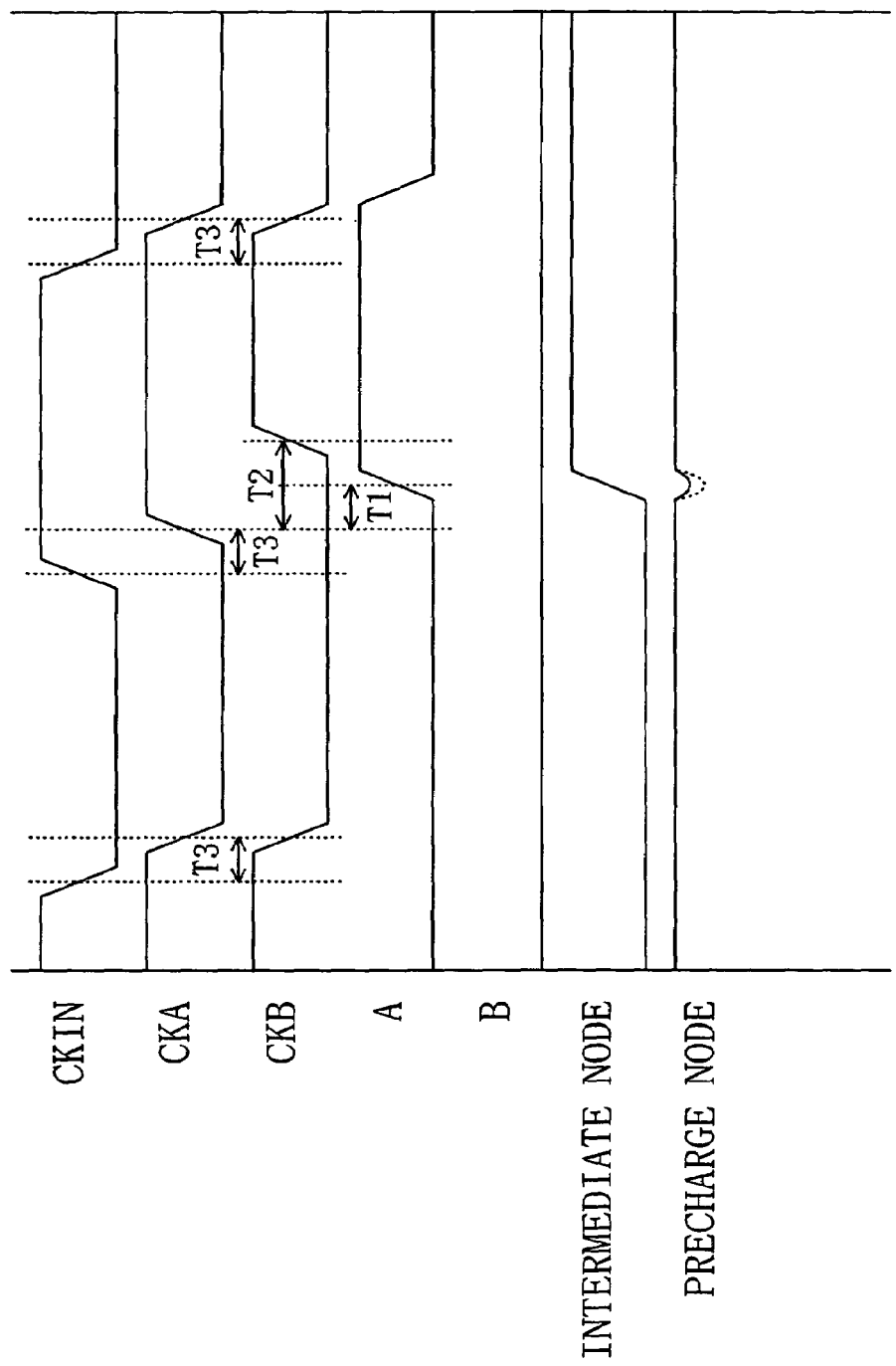
FIG. 3 is a waveform diagram of signals of respective sections of the dynamic circuits according to the first, second and fourth embodiments of the present invention.

FIG. 2 is a circuit that produces the first clock signal CKA and the second clock signal CKB. Referring to FIG. 2, a reference numeral 25 denotes an original clock input terminal. The first clock signal CKA and the second clock signal CKB are produced from an original clock signal CKIN from the original clock input terminal 25, and are outputted from output terminals 26 and 27, respectively. The output terminal 26 for the first clock signal CKA is connected to the first clock input terminal 7 in FIG. 1. The output terminal 27 for the second clock signal CKB is connected to the second clock input terminal 10 in FIG. 1. In FIG. 2, a reference numeral 21a denotes a buffer, and the delay from input to output is T2. T2 is adjusted to satisfy the relation T2>T1. A reference numeral 22a denotes an AND gate, and the delay from input to output is T3. A reference numeral 21b denotes a buffer, and the delay from input to output is T3, which is the same as that in the AND gate 22a. FIG. 3 is a waveform diagram of signals of the dynamic circuit in FIGS. 1 and 2.

Operation of the above-configured dynamic circuit according to the first embodiment of the present invention will now be described hereinafter. In the circuit for producing the first clock signal CKA and the second clock signal CKB from the original clock CKIN, the falling time of the first clock signal CKA is same as that of the second clock signal CKB. However, the rising time of the second clock signal CKB is delayed for T2 from that of the first clock signal CKA. First, the second clock signal CKB falls, the P-type MOS transistor 1 is conducted, and the precharge node 12 rises. Next, when the first clock signal CKA rises, only when the input signals A and B rise, the ground terminal is conducted from the precharge node 12 and the precharge node 12 falls. Herein, when only the input signal A rises and the input signal B maintains at Low, only between the precharge node 12 and the intermediate node 13 is conducted. When no charge is accumulated in the intermediate node 13, the charge in the precharge node 12 is shared to the intermediate node 13. However, since the second clock signal CKB rises after rise of the input signal A, even when the charge in the precharge node 12 is shared to the intermediate node 13, the charge is supplied to the precharge node 12 via the P-type MOS transistor 1. As such, the voltage drop of the precharge node 12 can be suppressed smaller than the conventional example (the precharge-node waveform in the conventional example is shown with a broken line in FIG. 3).

As described above, the first embodiment can reduce noise due to charge sharing of the precharge node 12.

Embodiment 2

Figure 4:
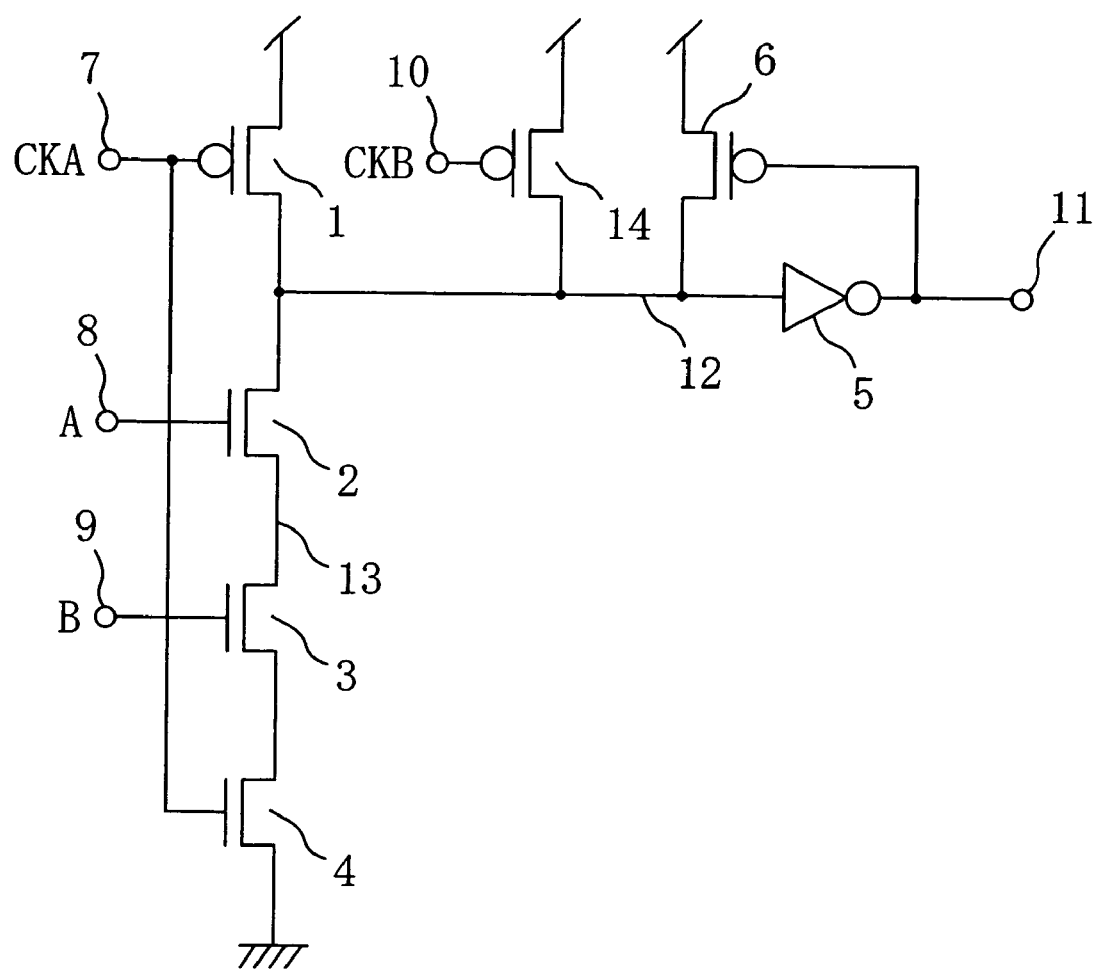
FIG. 4 is a circuit diagram of the dynamic circuit according to the second embodiment of the present invention.

FIG. 4 is a circuit diagram of a dynamic circuit according to a second embodiment of the present invention. Referring to FIG. 4, a reference numeral 1 denotes a P-type MOS transistor. The gate terminal of the P-type MOS transistor 1 is connected to a first clock input terminal 7. A precharge node 12 is charged to High in the Low period of a first clock signal CKA from the first clock input terminal 7. Reference numerals 2 to 4 denote N-type MOS transistors. The gate terminals of the N-type MOS transistors 2 to 4 are connected to input terminals 8 and 9 and the first clock input terminal 7, respectively. The N-type MOS transistor 2 is connected to the N-type MOS transistor 3 via an intermediate node 13. An input signal A from the input terminal 8 and an input signal B from the input terminal 9 fall in the Low period of the first clock signal CKA from the first clock input terminal 7. The input signals A and B maintain at Low or rise in the High period of the first clock signal CKA. Symbol "T1" represents an interval between when the first clock signal CKA rises and when the input signal A rises. A reference numeral 5 denotes an inverter that uses a precharge node 12 as an input, and an inversion output thereof is connected to an output terminal 11. A reference numeral 6 denotes a P-type MOS transistor. When an output signal from the output terminal 11 is Low, that is, when the precharge node 12 is High, the P-type MOS transistor 6 is conducted and the precharge node 12 is thereby maintained at High. The drivability of the P-type MOS transistor 6 is set lower than the drivability of each of the N-type MOS transistors 2 to 4. When the N-type MOS transistors 2 to 4 are conducted, the precharge node 12 falls. A reference numeral 14 denotes a P-type MOS transistor. The gate terminal of the P-type MOS transistor 14 is connected to the second clock input terminal 10. In the Low period of the second clock signal CKB from the second clock input terminal 10, the charge is supplied to the precharge node 12.

In the second embodiment, the clock-signal generation circuit is the same as that of the first embodiment. Also the waveforms of the signal of the dynamic circuit are the same as those of the first embodiment in FIG. 3.

Operation of the above-configured dynamic circuit according to the second embodiment of the present invention will now be described hereinafter. In the circuit for producing the first clock signal CKA and the second clock signal CKB from the original clock CKIN, the falling time of the first clock signal CKA is same as that of the second clock signal CKB. However, the rising time of the second clock signal CKB is delayed for T2 from that of the first clock signal CKA. First, the first clock signal CKA and the second clock signal CKB fall, the P-type MOS transistors 1 and 14 are conducted, and the precharge node 12 rises. Next, when the first clock signal CKA rises, only when the input signals A and B rise, the ground terminal is conducted from the precharge node 12 and the precharge node 12 falls. Herein, when only the input signal A rises and the input signal B maintains at Low, only between the precharge node 12 and the intermediate node 13 is conducted. When no charge is accumulated in the intermediate node 13, the charge in the precharge node 12 is shared to the intermediate node 13. However, since the second clock signal CKB rises after the rise of the input signal A, even when the charge in the precharge node 12 is shared to the intermediate node 13, the charge is supplied to the precharge node 12 via the P-type MOS transistor 14. As such, the voltage drop of the precharge node 12 can be suppressed smaller than the conventional example (the precharge-node waveform in the conventional example is shown with the broken line in FIG. 3).

As described above, the second embodiment can reduce noise due to charge sharing of the precharge node 12. In addition, as a P-type MOS transistor 1 to precharge in the Low period of the first clock signal CKA and another P-type MOS transistor 14 to reduce noise due to charge sharing are independently provided, the size of that P-type MOS transistor 14 can be optimized to reduce the noise. As such, the embodiment enables optimal charge supply effective for the noise reduction. Further, in the Low period of the first clock signal CKA, since the second clock signal CKB is also Low, the P-type MOS transistor 14 can be shared as a transistor for driving the precharge node 12 to High, the size of the P-type MOS transistor 1 can be reduced.

Embodiment 3

Figure 5:
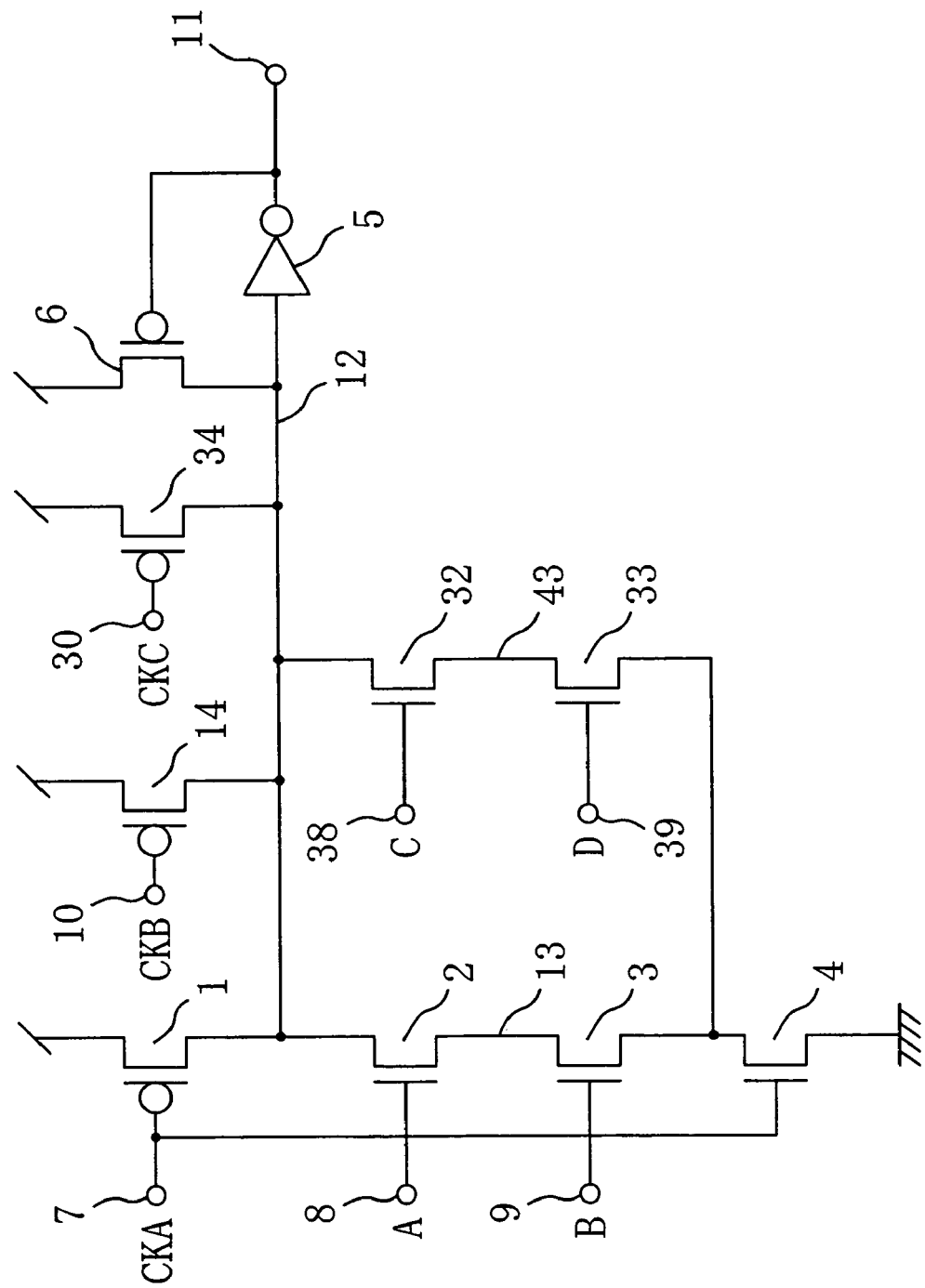
FIG. 5 is a circuit diagram of a dynamic circuit according to a third embodiment of the present invention.

FIG. 5 is a circuit diagram of a dynamic circuit according to a third embodiment of the present invention. Referring to FIG. 5, a reference numeral 1 denotes a P-type MOS transistor. The gate terminal of the P-type MOS transistor 1 is connected to a first clock input terminal 7. A precharge node 12 is charged to High in the Low period of a first clock signal CKA from the first clock input terminal 7. Reference numerals 2 to 4, 32, and 33 denote N-type MOS transistors. The gate terminals of the N-type MOS transistors 2 to 4, 32, and 33 are connected to input terminals 8 and 9, the first clock input terminal 7, and input terminals 38 and 39, respectively. The N-type MOS transistor 2 is connected to the N-type MOS transistor 3 via an intermediate node 13. The N-type MOS transistor 32 is connected to the N-type MOS transistor 33 via an intermediate node 43. An input signal A from the input terminal 8, an input signal B from the input terminal 9, an input signal C from the input terminal 38, and an input signal D from the input terminal 39 fall in the Low period of the first clock signal CKA from the first clock input terminal 7. The input signals A, B, C and D maintain at Low or rise in the High period of the first clock signal CKA. Symbol "T1" represents an interval between when the first clock signal CKA rises and when the input signal A rises, and symbol "T4" represents an interval between when the first clock signal CKA rises and when the input signal C rises. A reference numeral 5 denotes an inverter that uses a precharge node 12 as an input, and an inversion output thereof is connected to an output terminal 11. A reference numeral 6 denotes a P-type MOS transistor. When an output signal from the output terminal 11 is Low, that is, when the precharge node 12 is High, the P-type MOS transistor 6 is conducted and the precharge node 12 is thereby maintained at High. The drivability of the P-type MOS transistor 6 is set lower than that of each of the N-type MOS transistors 2 to 4, 32, and 33. When the ground terminal is conducted from the precharge node 12 by the N-type MOS transistors 2 to 4, 32, and 33, the precharge node 12 falls. A reference numeral 14 denotes a P-type MOS transistor. The gate terminal of the P-type MOS transistor 14 is connected to the second clock input terminal 10. In the Low period of the second clock signal CKB from the second clock input terminal 10, the charge is supplied to the precharge node 12. A reference numeral 34 denotes a P-type MOS transistor. The gate terminal of the P-type MOS transistor 34 is connected to a third clock input terminal 30. In the Low period of a third clock signal CKC from the third clock input terminal 30, the charge is supplied to the precharge node 12.

Figure 6:
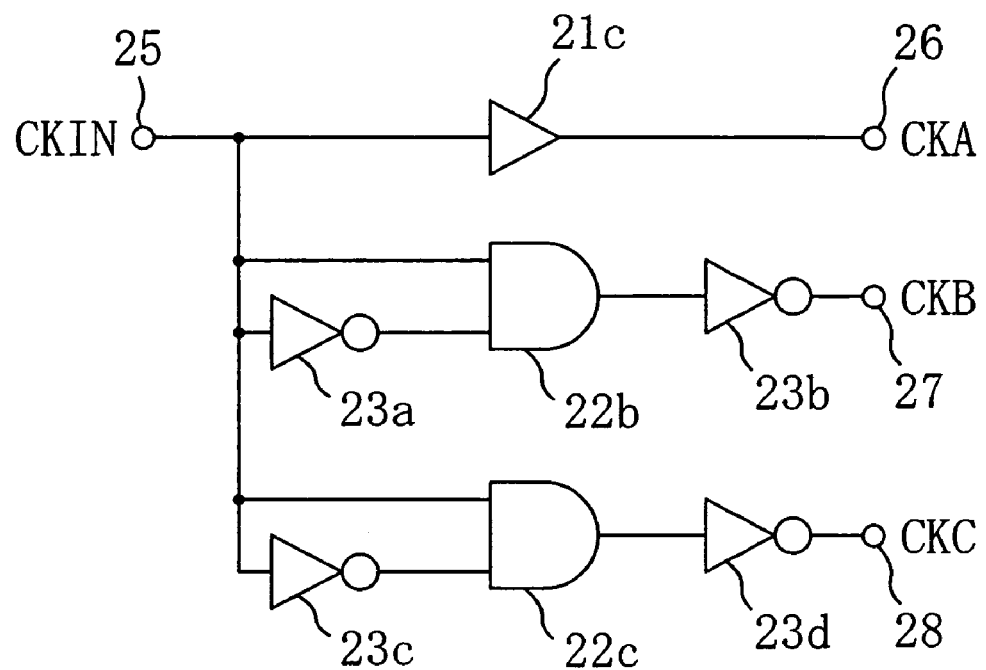
FIG. 6 is a circuit diagram of a clock-signal generation circuit of the dynamic circuit according to the third embodiment of the present invention.
Figure 7:
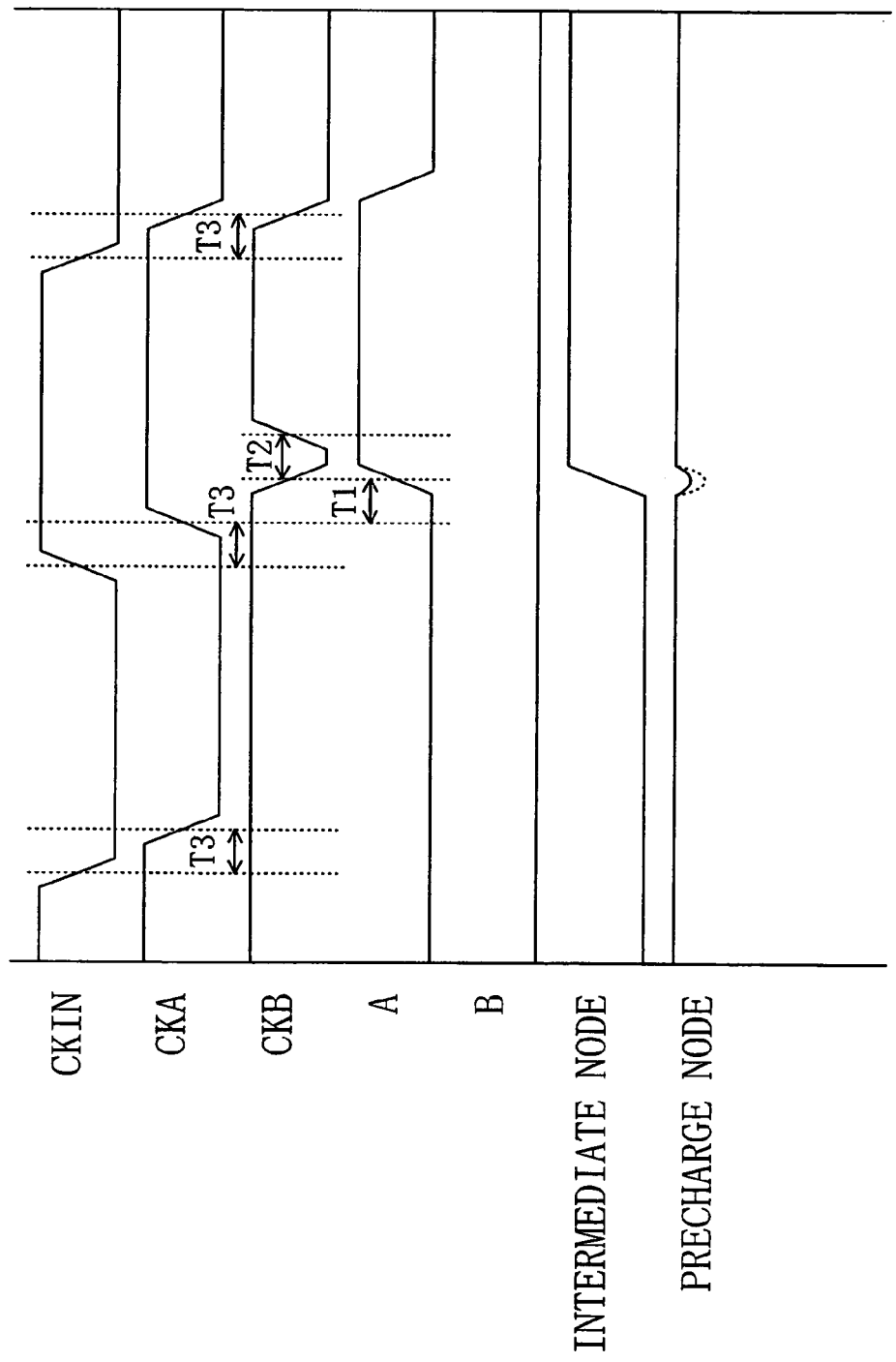
FIG. 7 is a waveform diagram of signals of respective sections of the dynamic circuit according to the third embodiment and a dynamic circuit according to a sixth embodiment of the present invention.

FIG. 6 is a circuit that produces the first clock signal CKA, the second clock signal CKB and the third clock signal CKC in FIG. 5. Referring to FIG. 6, a reference numeral 25 denotes an original clock input terminal. The first clock signal CKA, the second clock signal CKB and the third clock signal CKC are produced from an original clock signal CKIN from the original clock input terminal 25, and are outputted from output terminals 26 to 28, respectively. The output terminal 26 for the first clock signal CKA is connected to the first clock input terminal 7 in FIG. 5. The output terminal 27 for the second clock signal CKB is connected to the second clock input terminal 10 in FIG. 5. The output terminal 28 for the third clock signal CKC is connected to the third clock input terminal 30 in FIG. 5. In FIG. 6, a reference numeral 21c denotes a buffer, and the delay from input to output is T3. A reference numeral 23a denotes an inverter, and the delay from input to output is T2. A reference numeral 22b denotes an AND gate, and the delay from input to output is T3, which is the same as in the buffer 21c. A reference numeral 23b denotes an inverter, and the delay from input to output is adjusted to be T1. A reference numeral 23c denotes an inverter, and the delay from input to output is T5. A reference numeral 22c denotes an AND gate, and the delay from input to output is T3, which is the same as in the buffer 21c. A reference numeral 23d denotes an inverter, and the delay from input to output is adjusted to be T4. FIG. 7 is a waveform diagram of signals of the dynamic circuit shown in FIGS. 5 and 6.

Operation of the above-configured dynamic circuit according to the third embodiment of the present invention will now be described hereinafter. In the circuit for producing the first, second and third clock signals CKA, CKB and CKC from the original clock CKIN, the second clock signal CKB falls after the rise of the first clock signal CKA with a time interval of T1, and rises thereafter with a further time interval of T2. The third clock signal CKC falls after the rise of the first clock signal CKA with a time interval of T4, and rises thereafter with a further time interval of T5. First, the first clock signal CKA falls, the P-type MOS transistor 1 is conducted, and the precharge node 12 rises. Next, when the first clock signal CKA rises, only when the input signal A and the input signal B rise or only when the input signal C and D rise, the ground terminal is conducted from the precharge node 12 and the precharge node 12 falls. Herein, when only the input signal A rises and the input signals B, C and D maintain at Low, only between the precharge node 12 and the intermediate node 13 is conducted. When no charge is accumulated in the intermediate node 13, the charge in the precharge node 12 is shared to the intermediate node 13. However, since the second clock signal CKB falls synchronized with the rise of the input signal A, even when the charge in the precharge node 12 is shared to the intermediate node 13, the charge is supplied to the precharge node 12 via the P-type MOS transistor 14. As such, the voltage drop of the precharge node 12 can be suppressed smaller than the conventional example (the precharge-node waveform in the conventional example is shown with a broken line in FIG. 7). In addition, when only the input signal C rises and the input signal A, B and D maintain at Low, only between the precharge node 12 and the intermediate node 43 is conducted. When no charge is accumulated in the intermediate node 43, the charge in the precharge node 12 is shared to the intermediate node 43. However, since the third clock signal CKC falls synchronized with the rise of the input signal C, even when the charge in the precharge node 12 is shared to the intermediate node 43, the charge is supplied to the precharge node 12 via the P-type MOS transistor 34. As such, the voltage drop of the precharge node 12 can be suppressed smaller than the conventional example.

As described above, the third embodiment can reduce noise due to charge sharing of the precharge node 12 than the dynamic circuit of the conventional example. In addition, as a P-type MOS transistor 1 to precharge in the Low period of the first clock signal CKA and other P-type MOS transistors 14 and 34 to reduce noise due to charge sharing are provided, the sizes of the P-type MOS transistors 14 and 34 can be optimized to reduce the noise. As such, the embodiment enables optimal charge supply effective for the noise reduction. Further, P-type MOS transistors 14 and 34 are respectively provided for the intermediate nodes 13 and 43 to reduce noise due to charge sharing, and the sizes of the P-type MOS transistors 14 and 34 can be optimized to reduce the noise due to the charge sharing. As such, the embodiment enables optimal charge supply effective for the noise reduction for a plurality of charge sharing.

Embodiment 4

A dynamic circuit according to a fourth embodiment of the present invention is the same as that of the first embodiment. In this embodiment, however, the time interval between the rise of the first clock signal CKA and the rise of the input signal A is T1 and the time interval between the rise of the first clock signal CKA and the rise of the input signal B is T4 to satisfy the relationship T4<T1.

Figure 8:
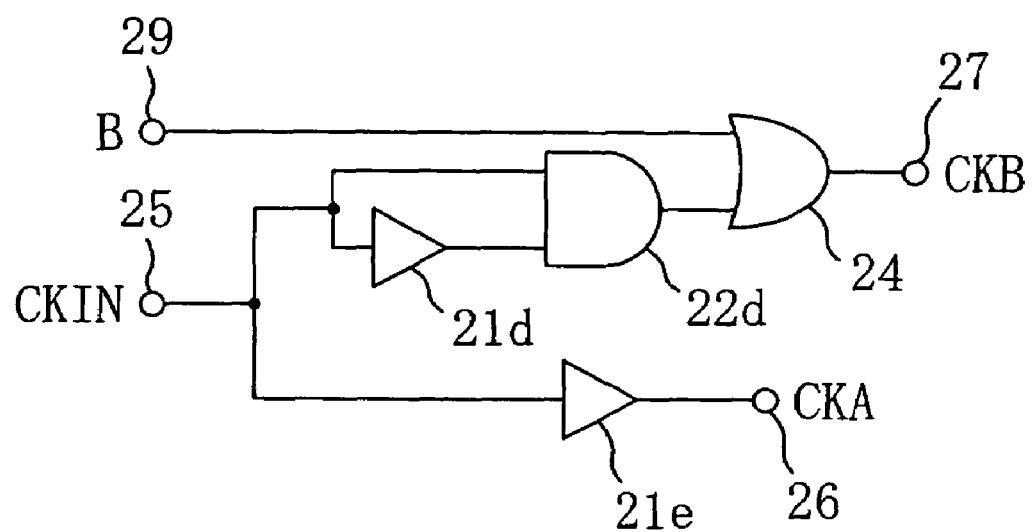
FIG. 8 is a circuit diagram of a clock-signal generation circuit of the dynamic circuit according to the fourth embodiment of the present invention.
Figure 9:
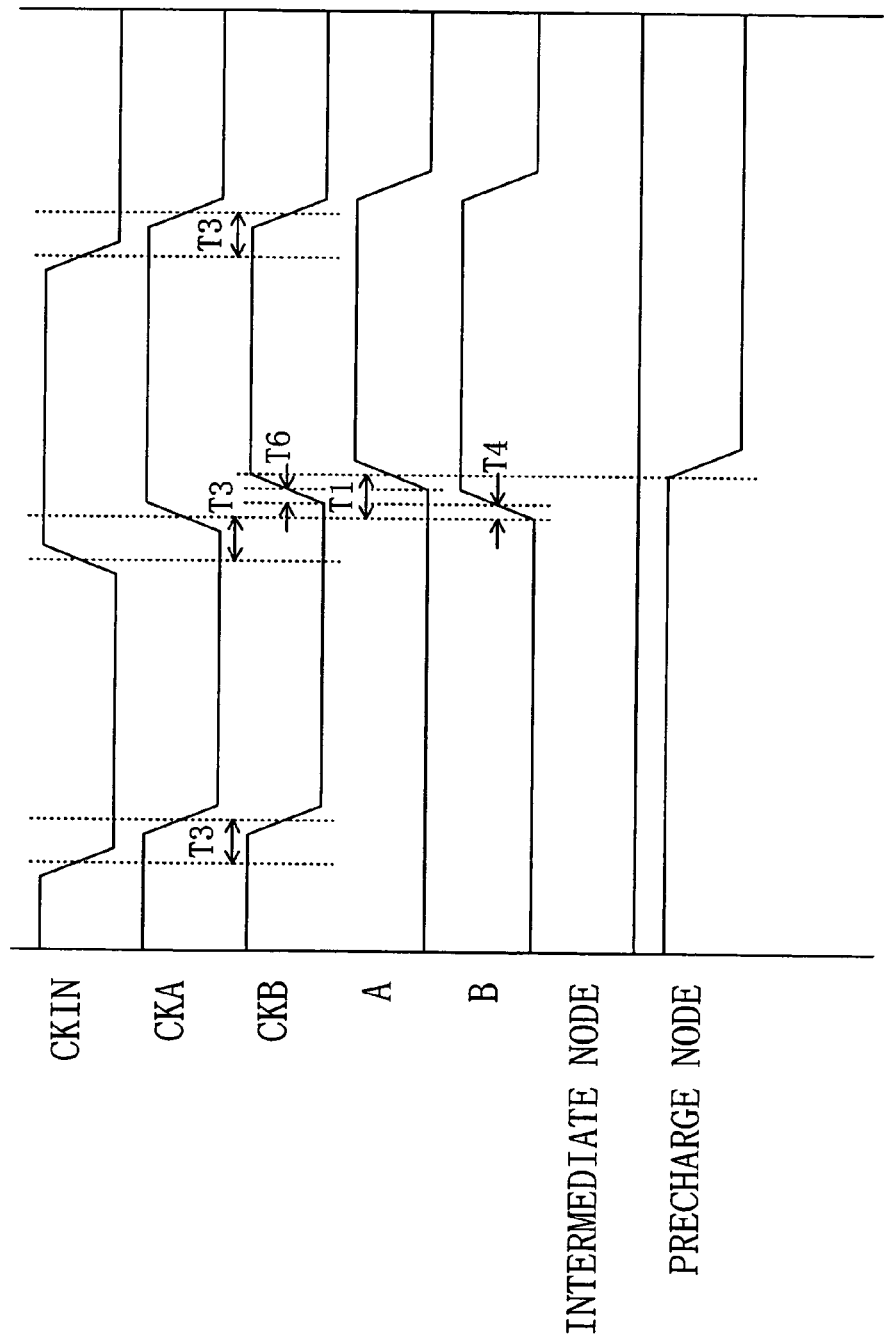
FIG. 9 is a waveform diagram of signals of the respective sections of the dynamic circuit according to the fourth embodiment of the present invention.

FIG. 8 is a circuit for producing the first clock signal CKA and second clock signal CKB in FIG. 1. Referring to FIG. 8, a reference numeral 25 denotes an original clock input terminal. The first clock signal CKA and the second clock signal CKB are produced from an original clock signal CKIN from the original clock input terminal 25 and an input signal B from an input terminal 29. An output terminal 26 for the first clock signal CKA is connected to the first clock input terminal 7 in FIG. 1. An output terminal 27 for the second clock signal CKB is connected to the second clock input terminal 10 in FIG. 1. The input terminal 29 is connected to the input terminal 9 in FIG. 1. A reference numeral 21d denotes a buffer, and the delay from input to output is T2. T2 is adjusted to satisfy the relation T2>T1. A reference numeral 22d denotes an AND gate, and the delay from input to output is T5. A reference numeral 24 denotes an OR gate 24, and the delay from input to output is T6. T6 is adjusted to satisfy the relations T5+T6=T3 and T4+T6<T1. A reference numeral 21e denotes a buffer, and the delay from input to output is T3. FIGS. 3 and 9 are waveform diagrams of signals of the dynamic circuits in FIGS. 1 and 8.

Operation of the above-configured dynamic circuit according to the fourth embodiment of the present invention will now be described hereinafter. In the circuit for producing the first clock signal CKA and the second clock signal CKB from the original clock CKIN, the falling time of the first clock signal CKA is same as that of the second clock signal CKB. For rising, when the input signal B maintains at Low after the change of the first clock signal CKA, the second clock signal CKB is delayed by T2. When the input signal B rises after the change of the first clock signal CKA, the second clock signal CKB is delayed by (T4+T6). First, the second clock signal CKB falls, the P-type MOS transistor 1 is conducted, and the precharge node 12 rises. Next, when the first clock signal CKA rises, only when the input signals A and B rise, the ground terminal is conducted from the precharge node 12 and the precharge node 12 falls. Herein, when only the input signal A rises and the input signal B maintains at Low, only between the precharge node 12 and the intermediate node 13 is conducted. When no charge is accumulated in the intermediate node 13, the charge in the precharge node 12 is shared to the intermediate node 13. However, since the second clock signal CKB rises after the rise of the input signal A, even when the charge in the precharge node 12 is shared to the intermediate node 13, the charge is supplied to the precharge node 12 via the P-type MOS transistor 1. As such, the voltage drop of the precharge node 12 can be suppressed smaller than the conventional example (the precharge-node waveform in the conventional example is shown with a broken line in FIG. 3). When both the input signals A and B rise (waveforms are shown in FIG. 9), the second clock signal CKB rises prior to the rise of the input signal A. Hence, when the ground terminal has been conducted from the precharge node 12, the P-type MOS transistor 1 is nonconductive, whereby the rise of the precharge node 12 is not impeded.

As described above, the fourth embodiment can reduce noise due to charge sharing of the precharge node 12 more than the dynamic circuit of the conventional example. In addition, in the fall of the precharge node 12, the P-type MOS transistor 1 is not conducted. Therefore, the fall of the precharge node 12 is not impeded, consequently preventing delay from being increased.

Embodiment 5

Figure 10:
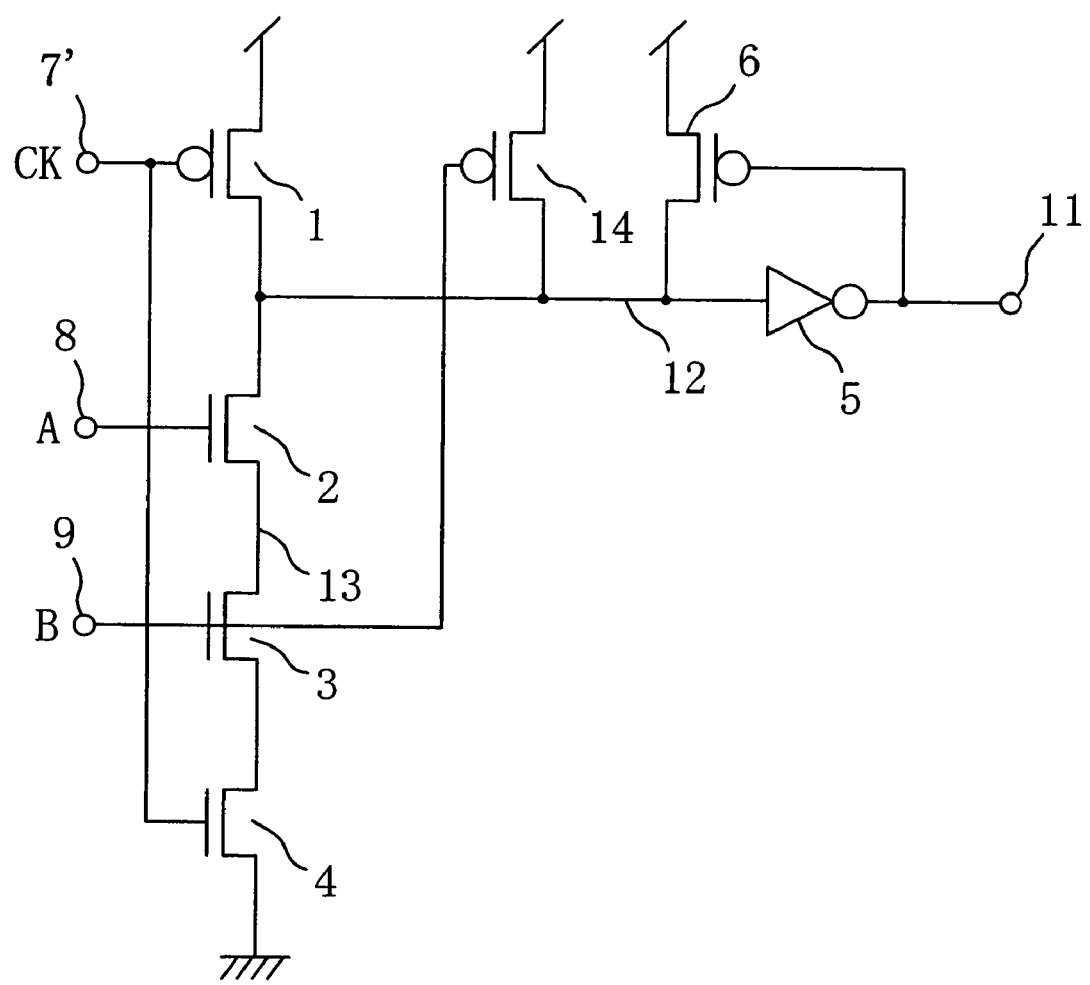
FIG. 10 is a circuit diagram of a dynamic circuit according to a fifth embodiment of the present invention.
Figure 11:
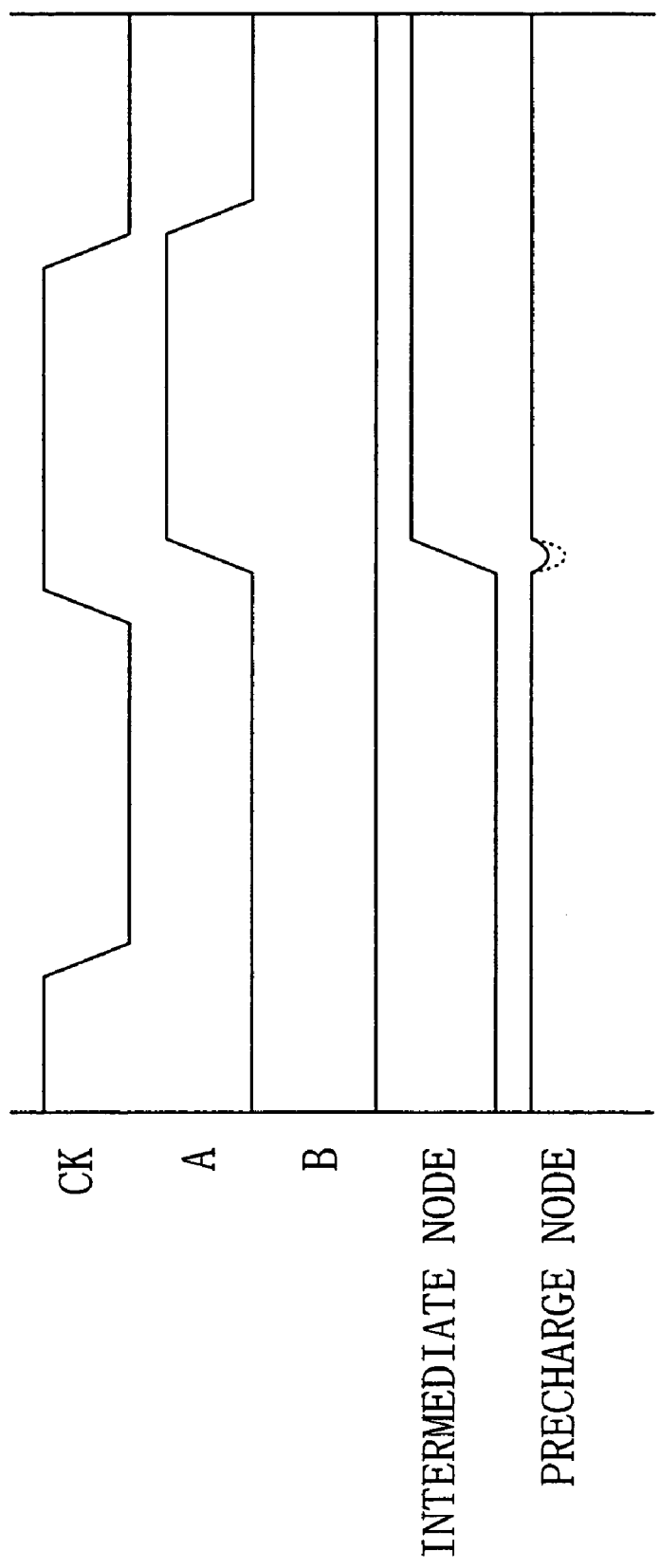
FIG. 11 is a waveform diagram of signals of respective sections of the dynamic circuit according to the fifth embodiment of the present invention.

FIG. 10 is a circuit diagram of a dynamic circuit according to a fifth embodiment of the present invention. Referring to FIG. 10, a reference numeral 1 denotes a P-type MOS transistor. The gate terminal of the P-type MOS transistor 1 is connected to a clock input terminal 7'. A precharge node 12 is charged to High in the Low period of a clock signal CK from the clock input terminal 7'. Reference numerals 2 to 4 denote N-type MOS transistors. The gate terminals of the N-type MOS transistors 2 to 4 are connected to input terminals 8 and 9 and the clock input terminal 7'. The N-type MOS transistor 2 is connected to the N-type MOS transistor 3 via an intermediate node 13. An input signal A from the input terminal 8 and an input signal B from the input terminal 9 fall in the Low period of the clock signal CK from the clock input terminal 7'. The input signals A and B maintain at Low or rise in the High period of the clock signal CK. A reference numeral 5 denotes an inverter that uses a precharge node 12 as an input, and an inversion output thereof is connected to an output terminal 11. A reference numeral 6 denotes a P-type MOS transistor. When an output signal from the output terminal 11 is Low, that is, when the precharge node 12 is High, the P-type MOS transistor 6 is conducted and the precharge node 12 is thereby maintained at High. The drivability of the P-type MOS transistor 6 is set lower than those of the N-type MOS transistors 2 to 4. When the N-type MOS transistors 2 to 4 are conducted, the precharge node 12 falls. A reference numeral 14 denotes a P-type MOS transistor that charges the precharge node 12 in the Low period of the input signal B. FIG. 11 illustrates waveforms of signals of the dynamic circuit in FIG. 10.

Operation of the above-configured dynamic circuit according to the fifth embodiment of the present invention will now be described hereinafter. First, the clock signal CK falls, the P-type MOS transistors 1 is conducted, and the precharge node 12 rises. Next, when the clock signal CK rises, only when the input signals A and B rise, the ground terminal is conducted from the precharge node 12 and the precharge node 12 falls. Herein, when only the input signal A rises and the input signal B maintains at Low, only between the precharge node 12 and the intermediate node 13 is conducted. When no charge is accumulated in the intermediate node 13, the charge in the precharge node 12 is shared to the intermediate node 13. However, when the input signal B maintains at Low, even when the charge in the precharge node 12 is shared to the intermediate node 13, the charge is supplied to the precharge node 12 via the P-type MOS transistor 14. As such, the voltage drop of the precharge node 12 can be suppressed smaller than the conventional example (the precharge-node waveform in the conventional example is shown with the broken line in FIG. 11).

As described above, the fifth embodiment can reduce noise due to charge sharing of the precharge node 12 more than the dynamic circuit of the conventional example. Further, this can be realized without an additional circuit for the clock signals of the conventional dynamic circuit.

Further, in the fifth embodiment, noise is generated only a time when the input signal A rises and the input signal B remains at Low. However, since the precharge transistor 14 which is in ON state at the time is provided in this embodiment, no noise is generated.

Embodiment 6

Figure 12:
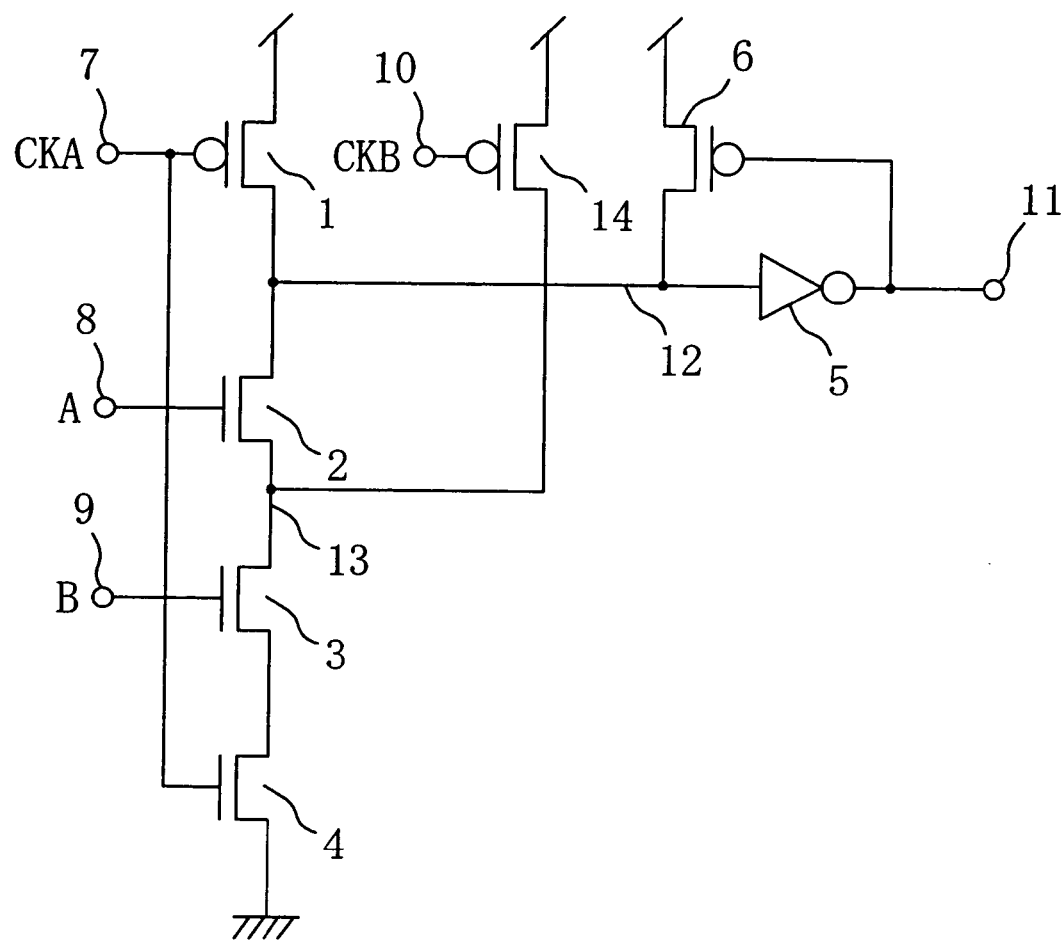
FIG. 12 is a circuit diagram of the dynamic circuit according to the sixth embodiment of the present invention.

FIG. 12 is a circuit diagram of a dynamic circuit according to a sixth embodiment of the present invention. Referring to FIG. 12, a reference numeral 1 denotes a P-type MOS transistor. The gate terminal of the P-type MOS transistor 1 is connected to a first clock input terminal 7. A precharge node 12 is charged to High in the Low period of a first clock signal CKA from the first clock input terminal 7. Reference numerals 2 to 4 denote N-type MOS transistors. The gate terminals of the N-type MOS transistors 2 to 4 are connected to input terminals 8 and 9 and the first clock input terminal 7. The N-type MOS transistor 2 is connected to the N-type MOS transistor 3 via an intermediate node 13. An input signal A from the input terminal 8 and an input signal B from the input terminal 9 fall in the Low period of the first clock signal CKA from the first clock input terminal 7. The input signals A and B maintain at Low or rise in the High period of the first clock signal CKA. Symbol "T1" represents an interval between when the first clock signal CKA rises and when the input signal A rises. A reference numeral 5 denotes an inverter that uses a precharge node 12 as an input, and an inversion output thereof is connected to an output terminal 11. A reference numeral 6 denotes a P-type MOS transistor. When an output signal from the output terminal 11 is Low, that is, when the precharge node 12 is High, the P-type MOS transistor 6 is conducted and the precharge node 12 is thereby maintained at High. The drivability of the P-type MOS transistor 6 is set lower those of the N-type MOS transistors 2 to 4. When the N-type MOS transistors 2 to 4 are conducted, the precharge node 12 falls. A reference numeral 14 denotes a P-type MOS transistor. The gate terminal of the P-type MOS transistor 14 is connected to the second clock input terminal 10. In the Low period of the second clock signal CKB from the second clock input terminal 10, the charge is supplied to the intermediate node 13.

Figure 13:
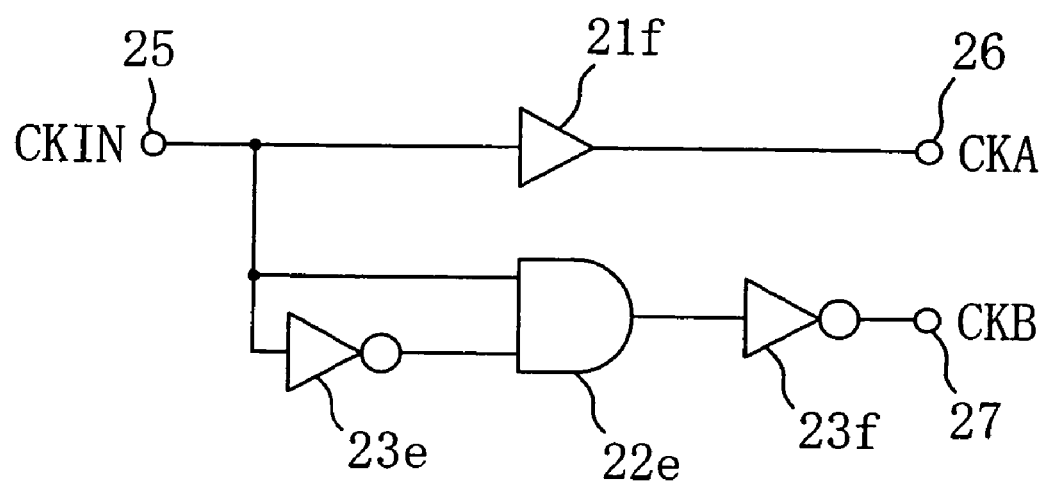
FIG. 13 is a circuit diagram of a clock-signal generation circuit of the dynamic circuit according to the sixth embodiment of the present invention.

FIG. 13 is a circuit that produces the first clock signal CKA and the second clock signal CKB. Referring to FIG. 13, a reference numeral 25 denotes an original clock input terminal. The first clock signal CKA and the second clock signal CKB are produced from an original clock signal CKIN from the original clock input terminal 25, and are outputted from output terminals 26 and 27, respectively. The output terminal 26 for the first clock signal CKA is connected to the first clock input terminal 7 in FIG. 12. The output terminal 27 for the second clock signal CKB is connected to the second clock input terminal 10 in FIG. 12. In FIG. 13, a reference numeral 21$f$ denotes a buffer, and the delay from input to output is T3. A reference numeral 23$e$ denotes an inverter, and the delay from input to output is T2. A reference numeral 22$e$ denotes an AND gate, and the delay from input to output is T3, which is the same as in the buffer 21$f$. A reference numeral 23$f$ denotes an inverter, and the delay from input to output is adjusted to T1. Waveforms of signals of the dynamic circuit are the same as those in the waveform diagram of FIG. 7.

Operation of the above-configured dynamic circuit according to the sixth embodiment of the present invention will now be described hereinafter. In the circuit for producing the first clock signal CKA and the second clock signal CKB from the original clock CKIN, the second clock signal CKB falls after the rise of the first clock signal CKA with a time interval of T1, and rises thereafter with a further time interval of T2. First, the first clock signal CKA falls, the P-type MOS transistor 1 is conducted, and the precharge node 12 rises. Next, when the first clock signal CKA rises, only when the input signals A and B rise, the ground terminal is conducted from the precharge node 12 and the precharge node 12 falls. Herein, when only the input signal A rises and the input signal B maintains at Low, only between the precharge node 12 and the intermediate node 13 is conducted. When no charge is accumulated in the intermediate node 13, the charge in the precharge node 12 is shared to the intermediate node 13. However, since the second clock signal CKB falls synchronized with the rise of the input signal A, even when the charge in the precharge node 12 is shared to the intermediate node 13, the charge is supplied to the intermediate node 13 via the P-type MOS transistor 14. As such, the voltage drop of the precharge node 12 can be suppressed smaller than the conventional example (the precharge-node waveform in the conventional example is shown with a broken line in FIG. 7).

As described above, the sixth embodiment can reduce noise due to charge sharing of the precharge node 12 more than the dynamic circuit of the conventional example. In addition, the embodiment can supply optimal charge effective for the noise reduction in a dynamic circuit with a plurality of intermediate nodes. This can be realized by providing independent P-type MOS transistors 14 to reduce noise due to charge sharing for the respective intermediate nodes 13.

As described above, according to each of the first, second, and fourth to sixth embodiments, the dynamic circuit performs AND operations for the input terminals A and B. In addition, according to the third embodiment, the dynamic circuit performs OR operations for the results of AND operations of the input terminals A and B and the results of AND operations for the input terminals C and D. However, as long as an intermediate node is formed, the number of input terminals, and the logical operations are not limited.

In each of the first to sixth embodiments, the N-type MOS transistor where the gate is connected to the clock signal is located at the ground terminal. However, the transistor may be omitted.

In each of the first to sixth embodiments, the inverter and the P-type MOS transistor are connected to the output. However, they may be omitted, or alternatively, a different circuit may be used.

Figure 14:
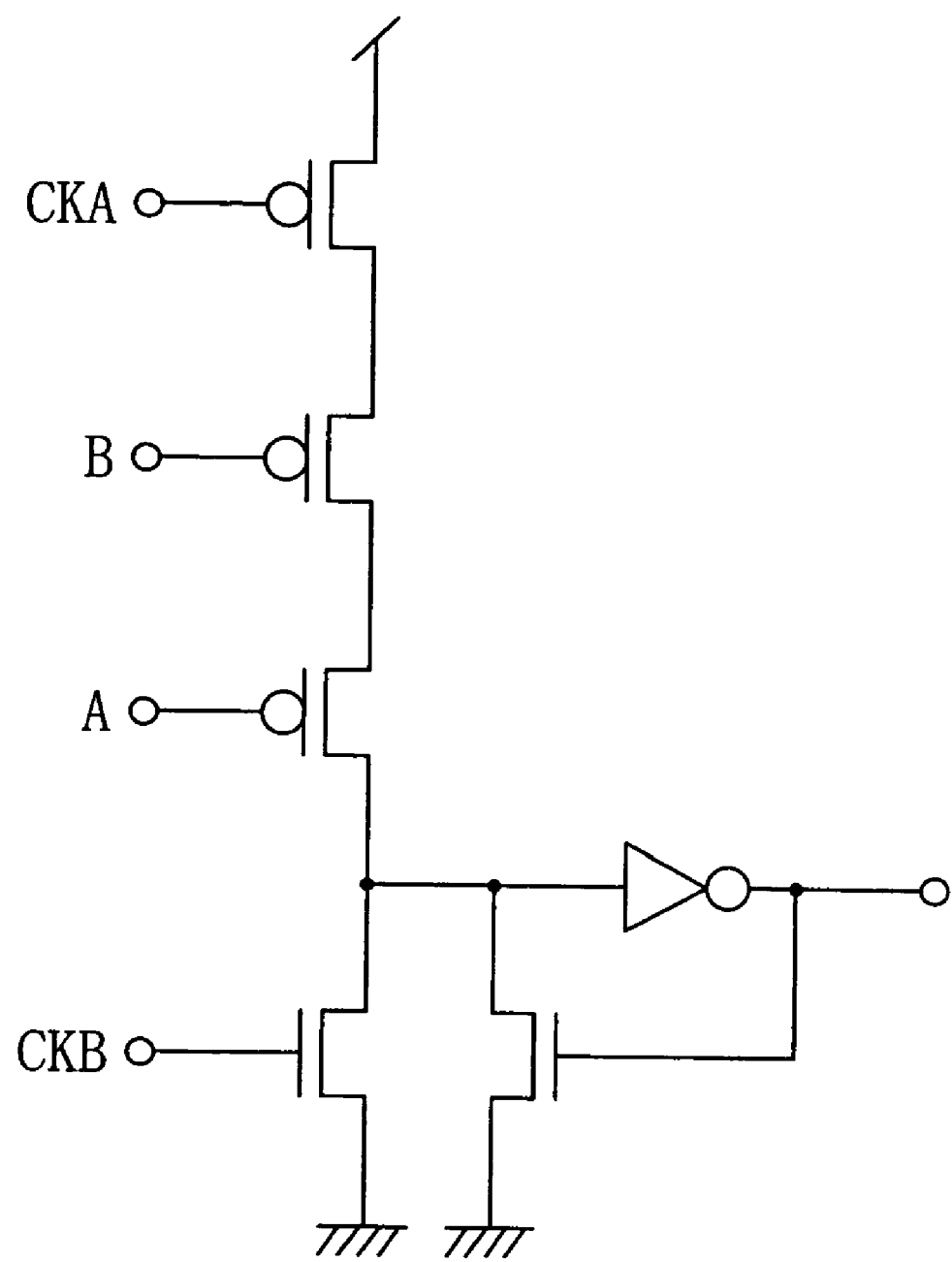
FIG. 14 is another circuit diagram of the dynamic circuit according to the first embodiment of the present invention.
Figure 15:
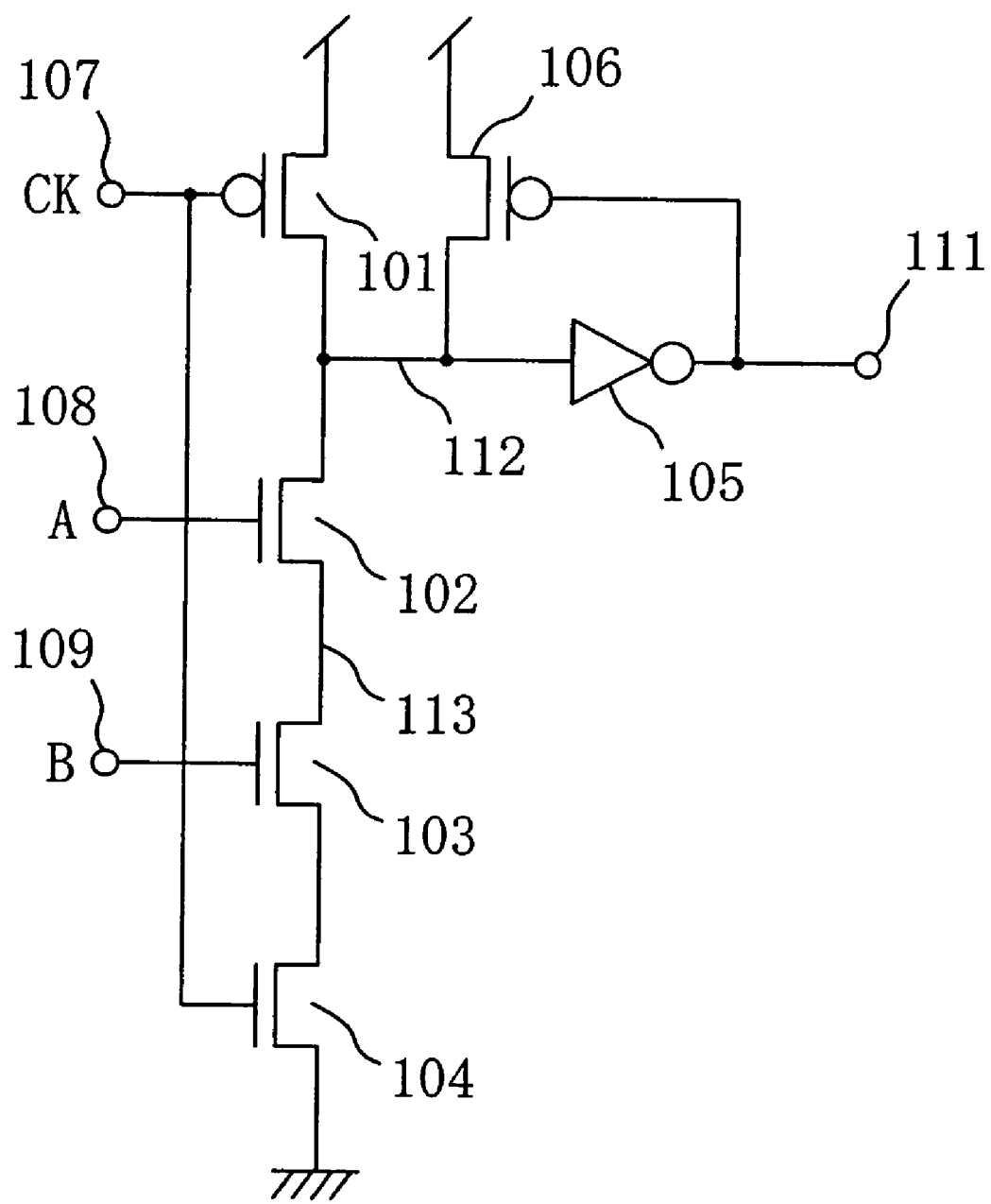
FIG. 15 is a circuit diagram of a conventional dynamic circuit.
Figure 16:
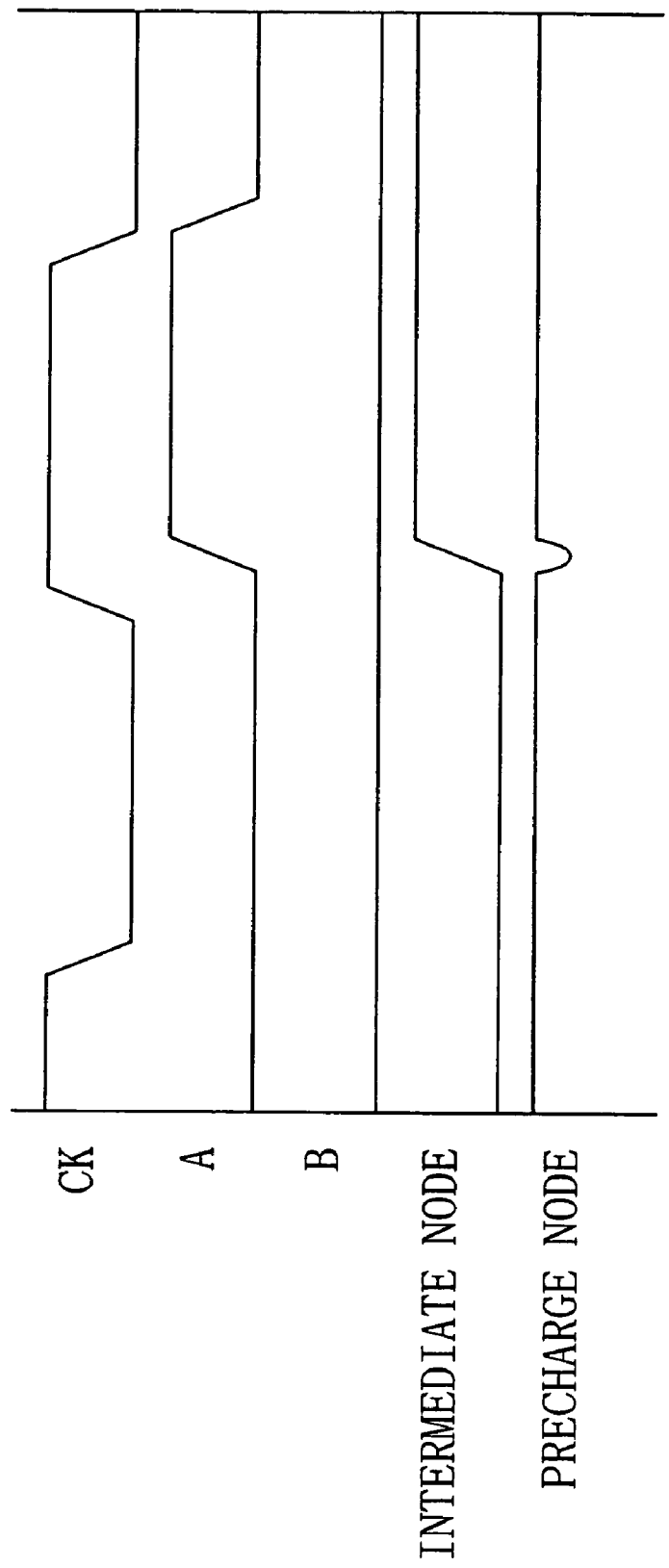
FIG. 16 is a waveform diagram of signals of respective sections of the conventional dynamic circuit.
Figure 17:
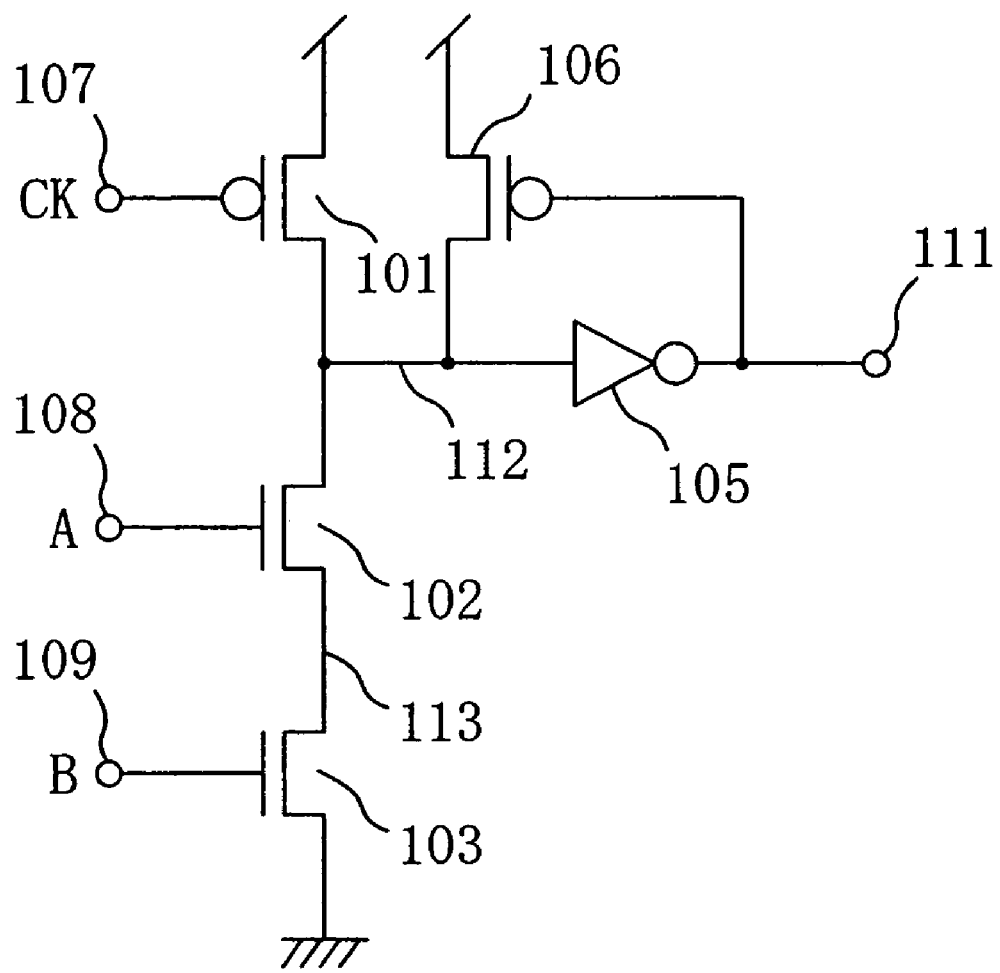
FIG. 17 is another circuit diagram of the conventional dynamic circuit.

In each of the first to sixth embodiments, the dynamic circuit is arranged such that the P-type MOS transistor causes the precharge node to rise, and N-type MOS transistors cause the precharge node to fall or to maintain at High. However, the dynamic circuit configuration may have a different arrangement. Specifically, the polarities of the power supply terminal and ground terminal, and the types of the P-type MOS transistor and N-type MOS transistor are changed. Thereby, the N-type MOS transistor is used to cause the precharge node to fall, and the P-type MOS transistors are used to cause the precharge node to rise or to maintain at Low. A circuit employing this arrangement with respect to FIG. 1 is shown in FIG. 14.

In the first and second embodiments, the circuit for producing the first clock signal CKA and the second clock signal CKB has the arrangement shown in FIG. 2. However, the circuit arrangement may be modified as long as the second clock signal CKB rises after the rise of the input signal A.

In the third embodiment, the circuit for producing the first clock signal CKA and the second clock signal CKB has the arrangement shown in FIG. 6. However, the circuit may be arranged as long as the second clock signal CKB falls at the time of the rise of the input signal A and the third clock signal CKC falls at the time of the rise of the input signal C. Further, a signal different from the original clock CKIN may be used to produce the second clock signal CKB and the third clock signal CKC.

In the fourth embodiment, the circuit for producing the first clock signal CKA and the second clock signal CKB has the arrangement shown in FIG. 8. However, the circuit may be arranged as long as it satisfies that when the input signal B maintains at Low, the second clock signal CKB rises after the rising of the input signal A, and when the input signal B rises, the second clock signal CKB rises prior to the rise of the input signal A.

In the fifth embodiment, the P-type MOS transistor 14 is provided to reduce the noise due to the charge sharing to the intermediate node 13. However, the circuit configuration may be arranged as long as charge is supplied to the precharge node 12 at least in one of the cases where charge sharing to the intermediate node 13 take place.

Further, in the sixth embodiment, although the P-type MOS transistor 14 for supplying charge to the intermediate node 13 is provided, when a plurality of intermediate nodes 13 are provided, P-type MOS transistors for supplying charge to parts or all of the intermediate nodes 13 may be provided.

What is claimed is:

1. A dynamic circuit comprising:
   a first clock input terminal;
   a plurality of input terminals;
   a precharge MOS transistor connecting a source-drain path between a first potential power supply and a precharge node and connecting a gate terminal to the first clock input terminal; and
   a plurality of logical-operating MOS transistors,
   wherein gate terminals of the plurality of logical-operating MOS transistors are connected to the plurality of input terminals, respectively, and
   at least one intermediate node is formed to connect the source-drain pats of the plurality of logical-operating MOS transistors between the precharge node and a second potential power supply,
   the dynamic circuit further comprising:
   a second clock input terminal; and
   a precharge MOS transistor, different from the precharge MOS transistor, connecting the source-drain path between the first potential power supply and the precharge node and connecting the gate terminal to the second clock input terminal,
   wherein the different precharge MOS transistor turns to be conductive from the time of formation of a conductive path from the intermediate node to the precharge node.

2. A dynamic circuit comprising:
   a first clock input terminal;
   a second clock input terminal;
   a plurality of input terminals;
   a precharge MOS transistor connecting a source-drain path between a first potential power supply and a precharge node and connecting a gate terminal to the first clock input terminal;
   a discharge MOS transistor connecting a source-drain path between a discharge node and a second potential power supply and connecting a gate terminal to the second clock input terminal; and
   a plurality of logical-operating MOS transistors,
   wherein gate terminals of the plurality of logical-operating MOS transistors are connected to one of the plurality of input terminals, respectively, and
   at least one intermediate node is formed to connect the source-drain paths of the plurality of logical-operating MOS transistors between the precharge node and the discharge node,
   the dynamic circuit further comprising:
   a third clock input terminal; and
   a precharge MOS transistor, different from the precharge MOS transistor, connecting a source-drain path between the first potential power supply and the precharge node and connecting a gate terminal to the third clock input terminal,
   wherein the different precharge MOS transistor turns to be conductive from the time of formation of a conductive path from the intermediate node to the precharge node.

3. The dynamic circuit according to claim 1, wherein a clock signal applied to the clock input terminal connected to the gate terminal of the different precharge MOS transistor is delayed so that the different precharge MOS transistor is conducted from the time of the formation of the conductive path from the intermediate node to the precharge node.

4. The dynamic circuit according to claim 1, wherein a clock signal applied to the clock input terminal connected to the gate terminal of the different precharge MOS transistor is produced by performing a logical operation with signals applied to the input terminals so tat the different precharge MOS transistor is conducted from the time of the formation of the conductive path from the intermediate node to the precharge node.

5. A dynamic circuit comprising:
   a first clock input terminal;
   a plurality of input terminals;
   a precharge MOS transistor connecting a source-drain path between a first potential power supply and a precharge node and connecting a gate terminal to the first clock input terminal; and
   a plurality of logical-operating MOS transistors,
   wherein gate terminals of the plurality of logical-operating MOS transistors are connected to one of the plurality of input terminals, respectively, and
   at least one intermediate node is formed to connect the source-drain paths of the plurality of logical-operating MOS transistors between the precharge node and a second potential power supply,
   the dynamic circuit further comprising:
   a second clock input terminal; and
   a precharge MOS transistor, different from the precharge MOS transistor, connecting a source-drain path between the first potential power supply and the precharge node and connecting a gate terminal to the second clock input terminal
   wherein the different precharge MOS transistor turns to be conductive from the time of formation of a conductive path from the intermediate node to the precharge node.

6. A dynamic circuit comprising:
   a first clock input terminal;
   a second clock input terminal;
   a plurality of input terminals;
   a precharge MOS transistor connecting a source-drain pat between a first potential power supply and a precharge node and connecting a gate terminal to the first clock input terminal;
   a discharge MOS transistor connecting a source-drain path between a discharge node and a second potential power supply and connecting a gate terminal to the second clock input terminal; and
   a plurality of logical-operating MOS transistors,
   wherein gate terminals of the plurality of logical-operating MOS transistors are connected to one of the plurality of input terminals, respectively, and
   at least one intermediate node is formed to connect the source-drain paths of the plurality of logical-operating MOS transistors between the precharge node and the discharge node,
   the dynamic circuit further comprising:
   a third clock input terminal; and a precharge MOS transistor, different from the precharge MOS transistor, connecting a source-drain path between the first potential power supply and the precharge node and connecting a gate terminal to the third clock input terminal, wherein the different precharge MOS transistor turns to be conductive from the time of formation of a conductive path from the intermediate node to the precharge node.

7. The dynamic circuit according to claim 5, wherein a clock signal applied to the clock input terminal connected to the gate terminal of the different precharge MOS transistor is delayed so that the different precharge MOS transistor is conducted even after the formation of the conductive path from the intermediate node to the precharge node.

8. The dynamic circuit according to claim 5, wherein a clock signal applied to the clock input terminal connected to the gate terminal of the different precharge MOS transistor is produced by performing a logical operation with signals applied to the input terminals so that the different precharge MOS transistor is conducted even after the formation of the conductive path from the intermediate node to the precharge node.

9. The dynamic circuit according to claim 2, wherein a clock signal applied to the clock input terminal connected to the gate terminal of the different precharge MOS transistor is delayed so that the different precharge MOS transistor is conducted from the time of the formation of the conductive path from the intermediate node to the precharge node.

10. The dynamic circuit according to claim 2, wherein a clock signal applied to the clock input terminal connected to the gate terminal of the different precharge MOS transistor is produced by performing a logical operation with signals applied to the input terminals so that the different precharge MOS transistor is conducted from the time of the formation of the conductive pat from the intermediate node to the precharge node.

11. The dynamic circuit according to claim 6, wherein a clock signal applied to the clock input terminal connected to the gate terminal of the different precharge MOS transistor is delayed so that the different precharge MOS transistor is conducted even after the formation of the conductive path from the intermediate node to the precharge node.

12. The dynamic circuit according to claim 6, wherein a clock signal applied to the clock input terminal connected to the gate terminal of the different precharge MOS transistor is produced by performing a logical operation with signals applied to the input terminals so that the different precharge MOS transistor is conducted even after the formation of the conductive path from the intermediate node to the precharge node.

* * * * *